United States Patent
Kuroki

(10) Patent No.: US 7,138,219 B2
(45) Date of Patent: *Nov. 21, 2006

(54) PLANOGRAPHIC PRINTING PLATE MATERIAL AND PLANOGRAPHIC PRINTING PLATE PREPARING PROCESS

(75) Inventor: Takaaki Kuroki, Hachioji (JP)

(73) Assignee: Konica Minolta Medical & Graphic, Inc., Tokyo (JP)

( * ) Notice: Subject to any disclaimer, the term of this patent is extended or adjusted under 35 U.S.C. 154(b) by 40 days.

This patent is subject to a terminal disclaimer.

(21) Appl. No.: 10/923,415

(22) Filed: Aug. 20, 2004

(65) Prior Publication Data

US 2005/0048403 A1    Mar. 3, 2005

(30) Foreign Application Priority Data

Aug. 29, 2003    (JP)    ............................. 2003-306272

(51) Int. Cl.
*G03F 7/029*    (2006.01)

(52) U.S. Cl. ............... 430/281.1; 430/286.1; 430/302; 430/309; 430/434; 430/435; 430/494

(58) Field of Classification Search ............ 430/270.1, 430/271.1, 273.1, 281.1, 283.1, 284.1, 286.1, 430/302, 309, 434, 435, 494
See application file for complete search history.

(56) References Cited

U.S. PATENT DOCUMENTS

| | | | |
|---|---|---|---|
| 4,983,498 A * | 1/1991 | Rode et al. ............... | 430/284.1 |
| 4,985,341 A * | 1/1991 | Rode et al. ............... | 430/287.1 |
| 4,987,056 A * | 1/1991 | Imahashi et al. ......... | 430/281.1 |
| 5,049,479 A | 9/1991 | Zertani et al. | |
| 5,085,974 A * | 2/1992 | Frass et al. ............... | 430/284.1 |
| 6,153,660 A * | 11/2000 | Fujimaki et al. ............... | 522/29 |
| 2004/0091816 A1 | 5/2004 | Matsumura et al. | |
| 2004/0157154 A1* | 8/2004 | Kuroki et al. ........... | 430/270.1 |
| 2004/0219459 A1* | 11/2004 | Hirabayash ................. | 430/300 |
| 2005/0037286 A1* | 2/2005 | Hirabayashi et al. .... | 430/281.1 |

* cited by examiner

*Primary Examiner*—Barbara L. Gilliam
(74) *Attorney, Agent, or Firm*—Frishauf, Holtz, Goodman & Chick, P.C.

(57) ABSTRACT

Disclosed is a planographic printing plate material comprising a hydrophilic support and provided thereon, a light sensitive layer and an overcoat layer in that order, wherein the light sensitive layer contains (a) an alkali soluble polymer, (b) a polymerizable compound having an ethylenically unsaturated bond, (c) a polymerization initiator, and (d) an anionic dye represented by the following formula (1), Formula (1)

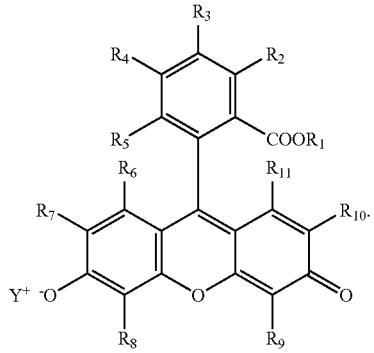

7 Claims, No Drawings

PLANOGRAPHIC PRINTING PLATE MATERIAL AND PLANOGRAPHIC PRINTING PLATE PREPARING PROCESS

FIELD OF THE INVENTION

The present invention relates to a planographic printing plate material with high sensitivity which is capable of being exposed with laser, and a process of preparing a planographic printing plate employing the same, and particularly to a planographic printing plate material capable of being exposed with low power laser, which improves storage stability and preheating latitude, and minimizes sludge, and a process of preparing a planographic printing plate employing the same.

BACKGROUND OF THE INVENTION

In recent years, as a printing plate for off-set printing, a large number of computer to plate (CTP) systems have been developed and put into practical use, which imagewise exposes directly to a planographic printing plate material employing laser light based on digital image data to record an image on the material. As the CTP systems, there are a silver salt system, a radical polymerization system and a thermal system, which differ in characteristics.

The radical polymerization system has characteristics providing high sensitivity and high printing durability, and is widely applied in printing fields such newspaper printing. The general radical polymerization is disclosed in many literatures such as Japanese Patent O.P.I. Publication No. 10-104835. A composition comprising an arene compound as a polymerization initiator is disclosed in Japanese Patent O.P.I. Publication No. 1-152109. Japanese Patent Publication No. 2755723 discloses, as a composition providing high sensitivity and high printing durability, a photopolymerizable composition which comprises a polymer binder, a free-radical polymerizable compound, a photoreduction dye (photo-initiator), and a trihalomethyl compound and a metallocene compound as another photo-initiator, and discloses in the examples a composition comprising an alcohol soluble eosin, a trihalomethyltriazine, and a titanocene compound. A composition disclosed in this patent document provides excellent sensitivity and printing durability, which is preferred, however, a planographic printing plate material comprising the composition is greatly lowered in storage stability after long term storage, resulting in insufficient practical properties.

The radical polymerization system generally employs a process comprising exposure, heat treatment, water washing, alkali development, and water washing in that order. This system is a preferred one to obtain high printing durability by completing the radical polymerization. However, when printing plate materials having a different thickness were processed, the printing plate materials are heated at preheating to different temperature due to the different thickness, producing problem of causing development failure. As the countermeasure, an attempt has been made in which arrangement of rollers in an automatic processing machine (automatic processor) or pre-determination (provision) of preheating conditions to each plate thickness is examined.

As an effective method to widen the latitude as printing plate materials to various preheating conditions, there is a method which increases solubility of light sensitive layer. Typically, a resin having a high acid value or a photoinitiator system for accelerating reaction by heating has been studied. However, satisfactory preheating latitude has not yet obtained considering printing durability. Further, the above negative-working photopolymerization type printing plate material has problem in that sludge is likely to be produced in a developer, and does not have a satisfactory running property.

SUMMARY OF THE INVENTION

An object of the invention is to provide a planographic printing plate material providing high sensitivity, high printing durability, and good preheating latitude, and a process of preparing a planographic printing plate employing the same.

DETAILED DESCRIPTION OF THE INVENTION

The present inventors have studied an extensive study. As a result, they have found that the preheating latitude is widened by employing a specific anionic dye, storage stability is greatly improved by employing eosin having a specific structure, and a combined use of a titanocene compound provides good preheating latitude as well as high sensitivity and printing durability, and completed the invention. Further, they have found that use of the anionic dye in the invention provides a good running property.

The above object of the invention is attained by the following constitution.

1. A planographic printing plate material comprising a hydrophilic support and provided thereon, a light sensitive layer and an overcoat layer in that order, wherein the light sensitive layer contains (a) an alkali soluble polymer, (b) a polymerizable compound having an ethylenically unsaturated bond, (c) a polymerization initiator, and (d) an anionic dye represented by the following formula (1),

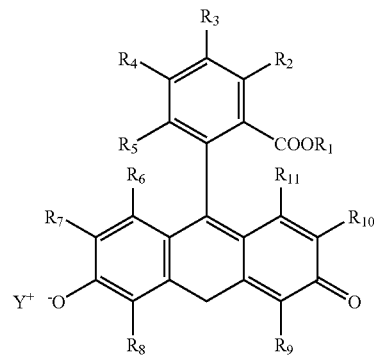

Formula (1)

wherein $R_1$ represents a substituted or unsubstituted alkyl group having a carbon atom number of from 4 to 18, a cycloalkyl group having a carbon atom number of from 4 to 18, or a substituted or unsubstituted aryl group having a carbon atom number of from 6 to 18; $R_2$ through $R_{11}$ independently represent a hydrogen atom, a halogen atom, a substituted or unsubstituted alkyl group having a carbon atom number of from 1 to 6, a cycloalkyl group having a carbon atom number of from 4 to 6, a substituted or unsubstituted aryl group having a carbon atom number of from 6 to 18 or —N($R_{12}$) ($R_{13}$) in which $R_{12}$ and $R_{13}$ independently represent a substituted or unsubstituted alkyl group having a carbon atom number of from 1 to 6, a cycloalkyl group having a carbon atom number of from 4 to 6, or a substituted or unsubstituted aryl group having a carbon atom number of from 6 to 18; and $Y^+$ represents a hydrogen ion, an alkali metal ion or an onium ion.

2. The planographic printing plate material of item 1 above, wherein the light sensitive layer contains a metallocene compound as the polymerization initiator.

3. The planographic printing plate material of item 2 above, wherein the light sensitive layer further contains a polyhalogenated compound as the polymerization initiator.

4. The planographic printing plate material of item 3 above, wherein the polyhalogenated compound is a polyhalomethylsulfone, a polyhalomethyl oxadiazole, or a compound having a polyhaloacetyl structure represented by the following formula (2),

Formula (2)

wherein $R^{21}$ represents a hydrogen atom, a bromine atom, a chlorine atom, an alkyl group, an aryl group, an acyl group, an alkylsulfonyl group, an arylsulfonyl group or a cyano group; $R^{22}$ represents a hydrogen atom or a monovalent organic substituent, provided that $R^{21}$ and $R^{22}$ may combine with each other to form a ring; and X represents a bromine atom or a chlorine atom.

5. The planographic printing plate material of any one of items 1 through 4 above, wherein the alkali soluble polymer has a weight average molecular weight of from 15,000 to 500,000, and an acid value of from 30 to 200.

6. The planographic printing plate material of any one of items 1 through 5 above, wherein the alkali soluble polymer has a repeating monomer unit having an ethylenically unsaturated bond in an amount of from 5 to 50 mol % in the molecule.

7. The planographic printing plate material of any one of items 1 through 6 above, wherein the polymerizable compound having an ethylenically unsaturated bond is a polyfunctional acrylate having an amido bond and a secondary or tertiary amino group in the molecule.

8. A planographic printing plate material comprising a hydrophilic support and provided thereon, a light sensitive layer and an overcoat layer in that order, wherein the light sensitive layer contains (a) an alkali soluble polymer, (b) a polymerizable compound having an ethylenically unsaturated bond, (c) a polymerization initiator, and (d) an anionic dye having an acidic group, a basic group or a hydroxyl group, each group reacting with a reactive compound to be modified with a substituted or unsubstituted alkyl group, a substituted or unsubstituted cycloalkyl group or an unsubstituted aryl group, wherein the reactive compound has an SP value of from 15 to 26 [$Mpa^{1/2}$].

9. The planographic printing plate material of item 8 above, wherein the light sensitive layer contains a metallocene compound as the polymerization initiator.

10. The planographic printing plate material of item 9 above, wherein the light sensitive layer further contains a polyhalogenated compound as the polymerization initiator.

11. The planographic printing plate material of item 10 above, wherein the polyhalogenated compound is a polyhalomethylsulfone, a polyhalomethyl oxadiazole, or a compound having a polyhaloacetyl structure represented by the following formula (2),

Formula (2)

wherein $R^{21}$ represents a hydrogen atom, a bromine atom, a chlorine atom, an alkyl group, an aryl group, an acyl group, an alkylsulfonyl group, an arylsulfonyl group or a cyano group; $R^{22}$ represents a hydrogen atom or a monovalent organic substituent, provided that $R^{21}$ and $R^{22}$ may combine with each other to form a ring; and X represents a bromine atom or a chlorine atom.

12. The planographic printing plate material of any one of items 8 through 11 above, wherein the alkali soluble polymer has a weight average molecular weight of from 15,000 to 500,000, and an acid value of from 30 to 200.

13. The planographic printing plate material of any one of items 8 through 12 above, wherein the alkali soluble polymer has repeating a monomer unit having an ethylenically unsaturated bond in an amount of from 5 to 50 mol % in the molecule.

14. The planographic printing plate material of any one of items 8 through 13 above, wherein the polymerizable compound having an ethylenically unsaturated bond is a polyfunctional acrylate having an amido bond and a secondary or tertiary amino group in the molecule.

15. A process of preparing a planographic printing plate, the process comprising the steps of imagewise exposing the planographic printing plate material of any one of items 1 through 14 above, employing a laser with an emission wavelength of from 400 to 600 nm; heating the resulting exposed material at a temperature of from 80 to 150° C. for 3 to 30 seconds; and developing the heated material with an alkali developer having a pH of from 10 to 12.5.

Next, the light sensitive layer, the overcoat layer, the hydrophilic support, and various additives, which constitute the planographic printing plate material of the invention, and an image formation process and a developing process will be explained.

<Light Sensitive Layer>

The light sensitive composition in the invention contains (a) an alkali soluble polymer, (b) a polymerizable compound (hereinafter also referred to as an ethylenically unsaturated compound) having an ethylenically unsaturated bond, (c) a polymerization initiator (hereinafter also referred to as an initiator), and (d) an anionic dye represented by formula (1) above.

(Anionic Dye)

The present invention is characterized in that a xanthene dye represented by formula (1) above is used as a photoinitiator.

In formula (1), the substituted or unsubstituted alkyl or cycloalkyl group having a carbon atom number of from 4 to 18 represented by $R_1$ above has a carbon atom number of preferably from 4 to 10. The substituted or unsubstituted aryl group having a carbon atom number of from 6 to 18 represented by $R_1$ above has a carbon atom number of preferably from 6 to 12. $R_1$ is especially preferably a substituted or unsubstituted alkyl group having a carbon atom number of from 4 to 10.

Examples of $R_1$ include butyl, hexyl, cyclohexyl, octyl, decyl, dodecyl, and phenyl. Of these, $R_1$ is preferably butyl, hexyl, cyclohexyl, or octyl. $R_2$ through $R_{11}$ independently represent preferably a hydrogen atom or a halogen atom (especially preferably a bromine atom). $Y^-$ is preferably a hydrogen ion or an alkali metal ion (i.e., sodium or potassium ion).

Typical examples of a dye represented by formula (1) will be listed below, but the invention is not specifically limited thereto.

1-1
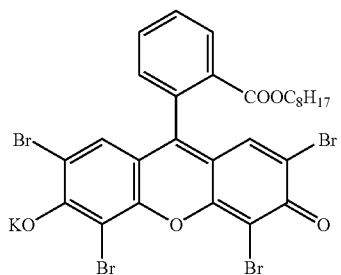

1-2
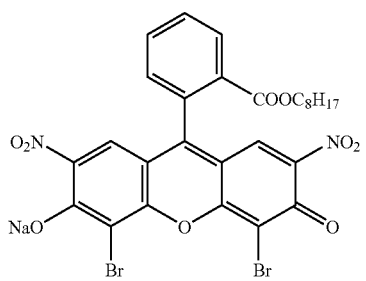

1-3
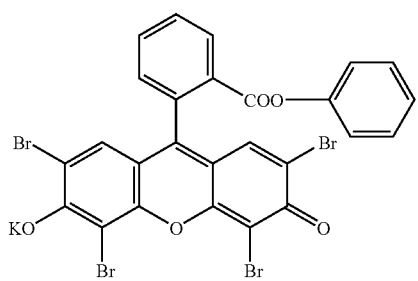

1-4
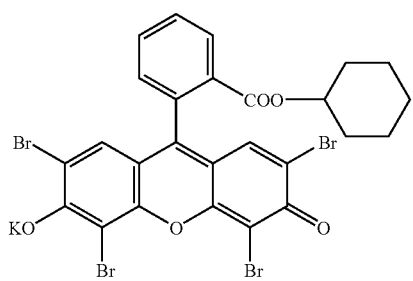

1-5
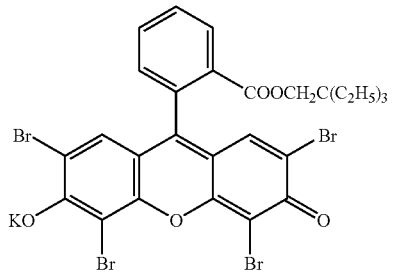

-continued

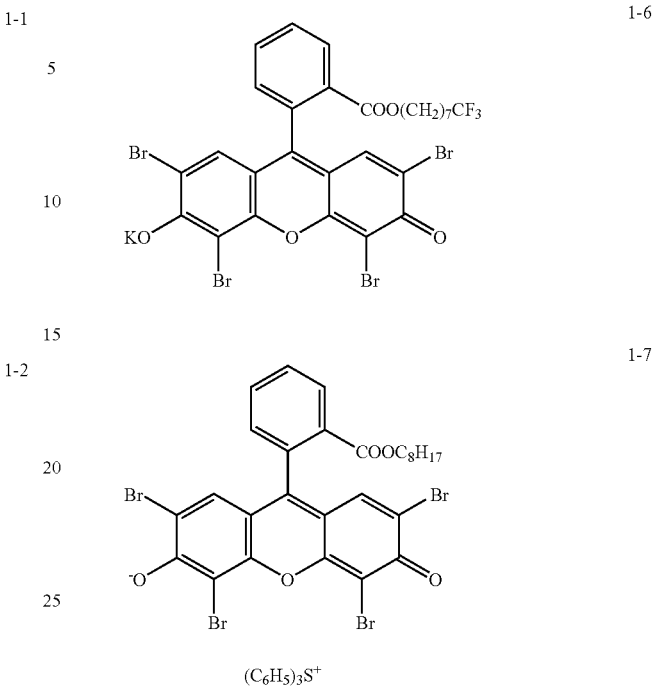

The anionic dye in item 8 above having in the molecule an acidic group, a basic group or a hydroxyl group refers to a dye having in the molecule having an acidic group (a known acidic substituent such as a carboxyl group, a sulfo group or a phosphonic acid group), a basic group (a known basic substituent such as an amino group) or a hydroxyl group (such as alcoholic or phenolic hydroxyl). The acidic group, basic group or hydroxyl group of the anionic dye above is modified to a substituted or unsubstituted alkyl group, a cycloalkyl group or a substituted or unsubstituted aryl group on reaction with a compound capable of reacting with the acidic group, basic group or hydroxyl group. The compound capable of reacting with the acidic group, basic group or hydroxyl group has an SP value of from 15 to 26 [$Mpa^{1/2}$].

As the compound capable of reacting with an acidic group, a basic group or a hydroxyl group, there is a hydroxyl group-containing compound, a cyclic ether such as an epoxy group-containing compound, a vinyl ether, or an amino group-containing compound, each being capable of reacting with an acidic group; a hydroxyl group-containing compound, an isocyanate group-containing compound or an acidic group-containing compound, each being capable of reacting with a basic group; or an acidic group-containing compound or an isocyanate group-containing compound, each being capable of reacting with a hydroxyl group.

An SP value of these compounds is preferably from 15 to 26 [$Mpa^{1/2}$]. However, preferred SP value is as follows according to kinds of the substituent the compounds have.

An SP value of a carboxyl group-containing compound is preferably from 15 to 26 [$Mpa^{1/2}$]. An SP value of an alcoholic hydroxyl group-containing compound is preferably from 15 to 26 [Mpa$^{1/2}$], and more preferably from 20 to 26 [Mpa$^{1/2}$]. An SP value of a phenolic hydroxyl group-containing compound is preferably from 15 to 25 [Mpa$^{1/2}$]. An SP value of an amino group-containing compound is preferably from 15 to 26 [Mpa$^{1/2}$].

As the compounds falling within the scope described above, among compounds described in "Polymer Handbook, Fourth Edition", VII, p. 675 et seq., compounds can be suitably used which have a group (for example, $R_1$ of formula (1)) reacting with the acidic group, basic group or hydroxyl group to be substituted with a substituted or unsubstituted alkyl group, a substituted or unsubstituted cycloalkyl group or an unsubstituted aryl group.

Examples of alcoholic hydroxyl group-containing compounds having an SP value of from 15 to 26 [Mpa$^{1/2}$] include propanol, isopropanol, butanol, isobutanol, cyclohexanol, pentanol, 2-ethyl-1-butanol, 1,3-dimethyl-1-butanol, 1-octanol, 2-octanol, decanol, undecanol, dodecanol, tridecyl alcohol, oleyl alcohol, allyl alcohol, 3-chloropropanol, benzyl alcohol, and diacetone alcohol. Alcoholic hydroxyl group-containing compounds having an SP value of preferably from 20 to 26 [Mpa$^{1/2}$] are propanol, isopropanol, butanol, isobutanol, cyclohexanol, pentanol, 2-ethyl-1-butanol, 1-octanol, 2-octanol, decanol, undecanol, allyl alcohol, 3-chloropropanol, benzyl alcohol, and diacetone alcohol.

(Alkali Soluble Polymer)

In the invention, the alkali soluble polymer refers to a polymer having an acid value and is preferably a copolymer having various structures described later.

As the copolymer, a polyacrylate resin, a polyvinylbutyral resin, a polyurethane resin, a polyamide resin, a polyester resin, an epoxy resin, a phenol resin, a polycarbonate resin, a polyvinyl butyral resin, a polyvinyl formal resin, a shellac resin, or another natural resin is preferably used. These resins can be used as an admixture of two or more thereof.

Of these, polymers having a hydroxyl group or a carboxyl group are preferably used, and polymers having a carboxyl group are more preferably used.

Of these, a vinyl copolymer is preferably used which is obtained by copolymerization of an acryl monomer, and more preferred is a copolymer containing (a) a carboxyl group-containing monomer unit and (b) an alkyl (meth) acrylate unit as the copolymerization component.

Examples of the carboxyl group-containing monomer include an α,β-unsaturated carboxylic acid, for example, acrylic acid, methacrylic acid, maleic acid, maleic anhydride, itaconic acid, itaconic anhydride or a carboxylic acid such as a half ester of phthalic acid with 2-hydroxymethacrylic acid.

Examples of the alkyl(meth)acrylate include an unsubstituted alkyl ester such as methyl(meth)acrylate, ethyl(meth) acrylate, propyl(meth)acrylate, butyl(meth)acrylate, amyl (meth)acrylate, hexyl(meth)acrylate, heptyl(meth)acrylate, octyl(meth)acrylate, nonyl(meth)acrylate, decyl(meth)acrylate, undecyl(meth)acrylate, or dodecyl(meth)acrylate; a cyclic alkyl ester such as cyclohexyl(meth)acrylate; and a substituted alkyl ester such as benzyl(meth)acrylate, 2-chloroethyl(meth)acrylate, N,N-dimethylaminoethyl(meth)acrylate, or glycidyl(meth)acrylate.

As another monomer unit, a monomer unit derived from the monomer described in the following items (1) through (14) can be used.

(1) A monomer having an aromatic hydroxy group, for example, o-, (p- or m-) hydroxystyrene, or o-, (p- or m-) hydroxyphenylacrylate;

(2) A monomer having an aliphatic hydroxy group, for example, 2-hydroxyethyl acrylate, 2-hydroxyethyl methacrylate, N-methylolacrylamide, N-methylolmethacrylamide, 4-hydroxybutyl acrylate, 4-hydroxybutyl methacrylate, 5-hydroxypentyl acrylate, 5-hydroxypentyl methacrylate, 6-hydroxyhexyl acrylate, 6-hydroxyhexyl methacrylate, N-(2-hydroxyethyl)acrylamide, N-(2-hydroxyethyl)methacrylamide, or hydroxyethyl vinyl ether;

(3) A monomer having an aminosulfonyl group, for example, m- or p-aminosulfonylphenyl methacrylate, m- or p-aminosulfonylphenyl acrylate, N-(p-aminosulfonylphenyl) methacrylamide, or N-(p-aminosulfonylphenyl)acrylamide;

(4) A monomer having a sulfonamido group, for example, N-(p-toluenesulfonyl)acrylamide, or N-(p-toluenesulfonyl) methacrylamide;

(5) An acrylamide or methacrylamide, for example, acrylamide, methacrylamide, N-ethylacrylamide, N-hexylacrylamide, N-cyclohexylacrylamide, N-phenylacrylamide, N-nitrophenylacrylamide, N-ethyl-N-phenylacrylamide, N-4-hydroxyphenylacrylamide, or N-4-hydroxyphenylmethacrylamide;

(6) A monomer having a fluorinated alkyl group, for example, trifluoromethyl acrylate, trifluoromethyl methacrylate, tetrafluoropropyl methacrylate, hexafluoropropyl methacrylate, octafluoropentyl acrylate, octafluoropentyl methacrylate, heptadecafluorodecyl methacrylate, heptadecafluorodecyl methacrylate, or N-butyl-N-(2-acryloxyethyl) heptadecafluorooctylsulfonamide;

(7) A vinyl ether, for example, ethyl vinyl ether, 2-chloroethyl vinyl ether, propyl vinyl ether, butyl vinyl ether, octyl vinyl ether, or phenyl vinyl ether;

(8) A vinyl ester, for example, vinyl acetate, vinyl chroloacetate, vinyl butyrate, or vinyl benzoate;

(9) A styrene, for example, styrene, methylstyrene, or chloromethystyrene;

(10) A vinyl ketone, for example, methyl vinyl ketone, ethyl vinyl ketone, propyl vinyl ketone, or phenyl vinyl ketone;

(11) An olefin, for example, ethylene, propylene, isobutylene, butadiene, or isoprene;

(12) N-vinylpyrrolidone, N-vinylcarbazole, or N-vinylpyridine,

(13) A monomer having a cyano group, for example, acrylonitrile, methacrylonitrile, 2-pentenenitrile, 2-methyl-3-butene nitrile, 2-cyanoethyl acrylate, or o-, m- or p-cyanostyrene;

(14) A monomer having an amino group, for example, N,N-diethylaminoethyl methacrylate, N,N-dimethylaminoethyl acrylate, N,N-dimethylaminoethyl methacrylate, polybutadiene urethane acrylate, N,N-dimethylaminopropyl acrylamide, N,N-dimethylacrylamide, acryloylmorpholine, N-isopropylacrylamide, or N,N-diethylacrylamide.

Further another monomer may be copolymerized with the above monomers.

As the polymer is also preferred an unsaturated bond-containing copolymer which is obtained by reacting a carboxyl group contained in the above vinyl copolymer molecule with for example, a compound having a (meth) acryloyl group and an epoxy group.

Examples of the compound having a (meth)acryloyl group and an epoxy group in the molecule include glycidyl acrylate, glycidyl methacrylate and an epoxy group-containing unsaturated compound disclosed in Japanese Patent O.P.I. Publication No. 11-27196.

Of the above alkali soluble polymers, those giving an acid value of from 30 to 200 are preferred. Of these, those further having a weight average molecular weight of from 15,000 to 500,000 are especially preferred.

Of the above polymers, those having a polymerizable unsaturated group are preferred, and those having 5 to 50 mol % of the polymerizable unsaturated group as a repeating unit are especially preferred.

In the invention, the weight average molecular weight of the polymers is measured by gel permeation chromatography (GPC).

In the invention, the acid value refers to the number of mg of potassium hydroxide (KOH) necessary to neutralize 1 g of the compound described above. The acid value can be determined as follows: A sample is diluted with methylcellosolve by a factor of 50, and the resulting solution is titrated with a 0.1 mol/liter potassium hydroxide solution. Inflection point of the pH curve obtained according to a pH meter is a neutralizing point, and the acid value is obtained from an amount of potassium hydroxide necessary to reach the neutralizing point.

An alkali soluble polymer having a polymerizable unsaturated group can be synthesized according to a conventional method without any limitations.

For example, a method can be used which reacts the carboxyl group described later with a glycidyl group, or reacts a hydroxyl group with an isocyanate group.

Typically, the alkali soluble polymer is a reaction product obtained by reacting a copolymer having a carboxyl group-containing monomer unit with an aliphatic epoxy-containing unsaturated compound such as allyl glycidyl ether, glycidyl (meth)acrylate, α-ethylglycidyl (meth)acrylate, glycidyl crotonate, glycidyl isocrotonate, crotonyl glycidyl ether, itaconic acid monoalkylmonoglycidyl ester, fumaric acid monoalkylmonoglycidyl ester, or maleic acid monoalkylmonoglycidyl ester; or an alicyclic epoxy-containing unsaturated compound such as 3,4-epoxycyclohexylmethyl (meth)acrylate. In the invention, when an amount of the carboxyl group reacted with the epoxy-containing unsaturated compound is represented in terms of mol %, The amount is preferably from 5 to 50 mol %, and more preferably from 10 to 30 mol % in view of sensitivity and printing durability.

Reaction of a copolymer having a carboxyl group-containing monomer unit with an epoxy-containing unsaturated compound is carried out for example, at 80 to 120° C. for 1 to 50 hours. The reaction product can be synthesized according to a conventional polymerization method, for example, a method described in literatures such as W. R. Sorenson & T. W. Cambell "Kobunshi Gosei Jikkenho" published by TOKYO KAGAKU DOHJIN, or Japanese Patent O.P.I. Publication Nos. 10-315598 and 11-271963, or a method similar to the above.

The content of the alkali soluble polymer in the light sensitive layer is preferably from 10 to 90% by weight, more preferably from 15 to 70% by weight, and still more preferably from 20 to 50% by weight.

Examples of the copolymer having a carboxyl group-containing monomer unit described above include a copolymer having at least one selected from units derived from the following monomers (1) through (17):

(1) A monomer having an aromatic hydroxy group;
(2) A monomer having an aliphatic hydroxy group;
(3) A monomer having an aminosulfonyl group;
(4) A monomer having a sulfonamido group;
(5) An α,β-unsaturated carboxylic acid;
(6) A substituted or unsubstituted alkyl acrylate;
(7) A substituted or unsubstituted alkyl acrylate;
(8) Acrylamide or methacrylamide;
(9) A monomer having a fluorinated alkyl group;
(10) A vinyl ether;
(11) A vinyl ester;
(12) A styrene;
(13) A vinyl ketone;
(14) An olefin;
(15) N-vinylpyrrolidone, N-vinylcarbazole, or N-vinylpyridine;
(16) A monomer having a cyano group; and
(17) A monomer having an amino group.

Typical examples thereof include a monofunctional acrylate such as 2-ethylhexyl acrylate, 2-hydroxypropyl acrylate, glycerol acrylate, tetrahydrofurfuryl acrylate, phenoxyethyl acrylate, nonylphenoxyethyl acrylate, tetrahydrofurfuryl-oxyethyl acrylate, tetrahydrofurfuryloxyhexanorideacrylate, an ester of 1,3-dioxane-ε-caprolactone adduct with acrylic acid, or 1,3-dioxolane acrylate; a methacrylate, itaconate, crotonate or maleate alternative of the above acrylate; a bifunctional acrylate such as ethyleneglycol diacrylate, triethyleneglycol diacrylate, pentaerythritol diacrylate, hydroquinone diacrylate, resorcin diacrylate, hexanediol diacrylate, neopentyl glycol diacrylate, tripropylene glycol diacrylate, hydroxypivalic acid neopentyl glycol diacrylate, neopentyl glycol adipate diacrylate, diacrylate of hydroxypivalic acid neopentyl glycol-ε-caprolactone adduct, 2-(2-hydroxy-1,1-dimethylethyl)-5-hydroxymethyl-5-ethyl-1,3-dioxane diacrylate, tricyclodecanedimethylol acrylate, tricyclodecanedimethylol acrylate-ε-caprolactone adduct or 1,6-hexanediol diglycidylether diacrylate; a dimethacrylate, diitaconate, dicrotonate or dimaleate alternative of the above diacrylate; a polyfunctional acrylate such as trimethylolpropane triacrylate, ditrimethylolpropane tetraacrylate, trimethylolethane triacrylate, pentaerythritol triacrylate, pentaerythritol tetraacrylate, dipentaerythritol tetraacrylate, dipentaerythritol pentaacrylate, dipentaerythritol hexacrylate, dipentaerythritol hexacrylate-ε-caprolactone adduct, pyrrogallol triacrylate, propionic acid dipentaerythritol triacrylate, propionic acid dipentaerythritol tetraacrylate or hydroxypivalylaldehyde modified dimethylolpropane triacrylate; a methacrylate, itaconate, crotonate or maleate alternative of the above polyfunctional acrylate.

(Ethylenically Unsaturated Compound)

As the ethylenically unsaturated compound in the invention, a compound having a monofunctional or polyfunctional ethylenically unsaturated group is suitably used.

The ethylenically unsaturated compound in the invention is preferably a polyfunctional acrylate having an amido bond and a primary or secondary amino group.

Typical examples of the ethylenically unsaturated compound include a monofunctional acrylate such as 2-ethylhexyl acrylate, 2-hydroxypropyl acrylate, glycerol acrylate, tetrahydrofurfuryl acrylate, phenoxyethyl acrylate, nonylphenoxyethyl acrylate, tetrahydrofurfuryl-oxyethyl acrylate, tetrahydrofurfuryloxyhexanorideacrylate, an ester of 1,3-dioxane-ε-caprolactone adduct with acrylic acid, or 1,3-dioxolane acrylate; a methacrylate, itaconate, crotonate or maleate alternative of the above acrylate; a bifunctional acrylate such as ethyleneglycol diacrylate, triethyleneglycol diacrylate, pentaerythritol diacrylate, hydroquinone diacrylate, resorcin diacrylate, hexanediol diacrylate, neopentyl glycol diacrylate, tripropylene glycol diacrylate, hydroxypivalic acid neopentyl glycol diacrylate, neopentyl glycol adipate diacrylate, diacrylate of hydroxypivalic acid neopentyl glycol-ε-caprolactone adduct, 2-(2-hydroxy-1,1-dimethylethyl)-5-hydroxymethyl-5-ethyl-1,3-dioxane diacrylate, tricyclodecanedimethylol acrylate, tricyclodecanedimethylol acrylate-ε-caprolactone adduct or 1,6-hexanediol diglycidylether diacrylate; a dimethacrylate, diitaconate, dicrotonate or dimaleate alternative of the above diacrylate; a polyfunctional acrylate such as trimethylolpropane triacrylate, ditrimethylolpropane tetraacrylate, trimethylolethane triacrylate, pentaerythritol triacrylate, pentaerythritol tetraacrylate, dipentaerythritol tetraacrylate, dipentaerythritol pentaacrylate, dipentaerythritol hexacrylate, dipentaerythritol hexacrylate-ε-caprolactone adduct, pyrrogallol triacrylate, propionic acid dipentaerythritol triacrylate, propionic acid dipentaerythritol tetraacrylate or hydroxypivalylaldehyde modified dimethylolpropane triacrylate; a methacrylate, itaconate, crotonate or maleate alternative of the above polyfunctional acrylate.

Prepolymers can be used, and the prepolymers can be used singly, in combination, or as an admixture thereof with the above described monomers and/or oligomers.

Examples of the prepolymer include polyester (meth)acrylate obtained by incorporating (meth)acrylic acid in a polyester of a polybasic acid such as adipic acid, trimellitic acid, maleic acid, phthalic acid, terephthalic acid, hymic acid, malonic acid, succinic acid, glutaric acid, itaconic acid, pyromellitic acid, fumalic acid, pimelic acid, sebatic acid, dodecanic acid or tetrahydrophthalic acid with a polyol such as ethylene glycol, ethylene glycol, diethylene glycol, propylene oxide, 1,4-butane diol, triethylene glycol, tetraethylene glycol, polyethylene glycol, grycerin, trimethylol propane, pentaerythritol, sorbitol, 1,6-hexanediol or 1,2,6-hexanetriol; an epoxyacrylate such as bisphenol A.epichlorhydrin.(meth)acrylic acid or phenol novolak.epichlorhydrin.(meth)acrylic acid obtained by incorporating (meth)acrylic acid in an epoxy resin; an urethaneacrylate such as ethylene glycol.adipic acid.tolylenediisocyanate.2-hydroxyethylacrylate, polyethylene glycol.tolylenediisocyanate.2-hydroxyethylacrylate, hydroxyethylphthalyl methacrylate.xylenediisocyanate, 1,2-polybutadieneglycol.tolylenediisocyanate.2-hydroxyethylacrylate or trimethylolpropane.propylene glycol.tolylenediisocyanate.2-hydroxyethylacrylate, obtained by incorporating (meth)acrylic acid in an urethane resin; a silicone acrylate such as polysiloxane acrylate, or polysiloxane.diisocyanate.2-hydroxyethylacrylate; an alkyd modified acrylate obtained by incorporating a methacroyl group in an oil modified alkyd resin; and a spiran resin acrylate.

The light sensitive layer in the light sensitive layer of the planographic printing plate material of the invention may contain a monomer such as a phosphazene monomer, triethylene glycol, an EO modified isocyanuric acid diacrylate, an EO modified isocyanuric acid triacrylate, dimethyloltricyclodecane diacrylate, trimethylolpropane acrylate benzoate, an alkylene glycol acrylate, or a urethane modified acrylate, or an addition polymerizable oligomer or prepolymer having a structural unit derived from the above monomer.

The ethylenically unsaturated compound used in the invention is a phosphate compound having at least one (meth)acryloyl group. The phosphate compound is a compound having a (meth)acryloyl group in which at least one hydroxyl group of phosphoric acid is esterified. The ethylenically unsaturated compound used in the invention is not limited, as long as it has a (meth)acryloyl group.

Besides the above compounds, compounds disclosed in Japanese Patent O.P.I. Publication Nos. 58-212994, 61-6649, 62-46688, 62-48589, 62-173295, 62-187092, 63-67189, and 1-244891, compounds described on pages 286 to 294 of "11290 Chemical Compounds" edited by Kagakukogyo Nipposha, and compounds described on pages 11 to 65 of "UV.EB Koka Handbook (Materials)" edited by Kobunshi Kankokai can be suitably used. Of these compounds, compounds having two or more acryl or methacryl groups in the molecule are preferable, and those having a molecular weight of not more than 10,000, and preferably not more than 5,000 are more preferable.

The compound having an amido bond and a secondary or tertiary amino group in the molecule preferably used in the invention is a compound represented by the following formula (I):

Formula (I)

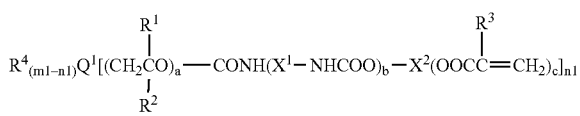

wherein $Q^1$ represents

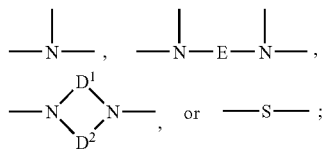

$R^4$ represents an alkyl group, a hydroxy alkyl group, or an aryl group; $R^1$ and $R^2$ independently represent a hydrogen atom, an alkyl group, or an alkoxyalkyl group; $R^3$ represents a hydrogen atom, a methyl group, or a methyl group; $X^1$ represents a divalent linkage group having a carbon atom number of from 2 to 12; $X^2$ represents a divalent linkage group, a trivalent linkage group, a tetravalent linkage group, or

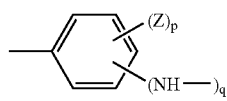

in which Z represents a hydrogen atom, an alkyl group, an alkenyl group, an aryl group, a halogen atom, an alkoxy group, or a heterocyclic group, p is an integer of from 1 to 4, and q is an integer of from 1 to 3; $D^1$ and $D^2$ independently represent a divalent linkage group having a carbon atom number of from 1 to 5; E represents an divalent group having a carbon atom number of from 2 to 12, an aliphatic group having a 5- to 7-membered heterocyclic ring containing one or two kinds of the atom selected from the group consisting of a nitrogen atom, an oxygen atom and a sulfur atom, an arylene group having a carbon atom number of from 6 to 12, or a 5- or 6-membered aromatic heterocyclic ring group; a is an integer of from 0 to 4; b is 0 or 1; c is an integer of from 1 to 3; m1 is an integer of from 2 to 4; and n1 is an integer of from 1 to m1, provided that plural groups having the same definition may be the same or different.

In formula (I), examples of the alkyl group represented by $R^4$ include a methyl group, an ethyl group, a propyl group, a butyl group, a pentyl group, an iso-pentyl group, a 2-eth ylhexyl group, an octyl group, a decyl group, an n-dodecyl group, an n-tetradecyl group, an n-pentadecyl group, an n-hexadecyl group, an n-heptadecyl group, an n-octadecyl group, and an n-docosadecyl group.

Examples of the hydroxyalkyl group represented by $R^4$ include a hydroxymethyl group, a hydroxyethyl group, a hydroxypropyl group, and a hydroxypentyl group.

Examples of the aryl group represented by $R^4$ include a phenyl group, and a naphthyl group.

Examples of the alkyl group represented by $R^1$ or $R^2$ are the same as those denoted in $R^4$ above.

Examples of the alkoxy group represented by $R^1$ or $R^2$ include a methoxymethyl group, a methoxyethyl group, an ethoxymethyl group, and a propoxyethyl group.

The divalent linkage group having a carbon atom number of from 2 to 12 represented by $X^1$ is a divalent saturated hydrocarbon group having a carbon atom number of from 2 to 12 or an arylene group having a carbon atom number of from 6 to 12. Examples of the divalent saturated hydrocarbon group having a carbon atom number of from 2 to 12 represented by $X^1$ include an ethylene group, a trimethylene group, a tetramethylene group, a propylene group, an ethylethylene group, a pentamethylene group, a hexamethylene group, a heptamethylene group, an octamethylene group, a nonamethylene group, a decamethylene group, an undecamethylene group, a dodecamethylene group, a cyclohexylene group (e.g., a 1,6-cyclohexanediyl group), and a cyclopentylene group (e.g., a 1,5-cyclopentanediyl group).

Examples of the arylene group having a carbon atom number of from 6 to 12 represented by $X^1$ include a phenylene group, and a naphthylene group.

Examples of the divalent group represented by $X^2$ include the same as those denoted in the divalent linkage having a carbon atom number of from 2 to 12 represented by $X^1$. Examples of the divalent group represented by $X^2$ further include those in which up to five methylene groups of the divalent saturated hydrocarbon group above are replaced by oxygen atoms.

Examples of the trivalent group represented by $X^2$ include an ethanetriyl group, a propanetriyl group, a butanetriyl group, a pentanetriyl group, a hexanetriyl group, a heptanetriyl group, an octanetriyl group, a nonanetriyl group, a decanetriyl group, an undecanetriyl group, a dodecanetriyl group, a cyclohexanetriyl group, a cyclopentanetriyl group, a benzenetriyl group and a naphthalenetriyl group.

Examples of the tetravalent group represented by $X^2$ include a propanediylidene group, a 1,3-propanediyl-2-ylidene group, a butanediylidene group, a pentanediylidene group, a hexanediylidene group, a heptanediylidene group, an octanediylidene group, a nonanediylidene group, a decanediylidene group, an undecanediylidene group, a dodecanediylidene group, a cyclohexanediylidene group, a cyclopentanediylidene group, a benzenetetrayl group and a naphthalenetetrayl group.

Examples of the alkyl group represented by Z include a methyl group, an ethyl group, a propyl group, a butyl group, a pentyl group, an isopentyl group, a 2-ethylhexyl group, an octyl group and a decyl group.

Examples of the alkenyl group represented by Z include a 2-propenyl group, a butenyl group, a 1-methyl-3-propenyl group, a 3-pentenyl group, a 1-methyl-3-butenyl group, and a 4-hexenyl group. Examples of the aryl group represented by Z include a phenyl group, a m-chlorophenyl group, a tolyl group, and a naphthyl group.

Examples of the halogen atom represented by Z include a fluorine atom, a chlorine atom, a bromine atom and an iodine atom.

Examples of the alkoxy group represented by Z include a methoxy group, an ethoxy group, a propoxy group, and a butoxy group.

Examples of the heterocyclic group represented by Z include a pyridyl group, a pyrrolyl group, a 2-methylpyrrolyl group, an indolyl group, an imidazolyl group, a furyl group, a thiazolyl group, and a pyrimidinyl group.

Examples of the divalent group having a carbon atom number of from 1 to 5 represented by $D^1$ or $D^2$ include a methylene group, a trimethylene group, a tetramethylene group, a propylene group, an ethylethylene group, a pentamethylene group, and a cyclopentylene group.

The divalent group having a carbon atom number of from 2 to 12 by E is the same as those denoted above in the divalent linkage group having a carbon atom number of from 2 to 12 represented by $X^1$.

In the aliphatic group having a 5- to 7-membered heterocyclic ring containing one or two kinds of the atom selected from the group consisting of a nitrogen atom, an oxygen atom and a sulfur atom, represented by E, the 5- to 7-membered heterocyclic ring is, for example, pyridine, furan, pyrrole, pyrazole, imidazole, oxazole, thiazole, pyrimidine, pyridazine, pyran, thiophene, isoxazole, pyrroline, imidazoline, pyrazolidine, pyrazoline, piperidine, piperazine, morpholine, or quinuclidine.

Examples of the aliphatic group include a divalent group having a carbon atom number of from 2 to 12 having the heterocyclic ring described above. The divalent group described above is the same as those denoted above in the divalent linkage group having a carbon atom number of from 2 to 12 represented by $X^1$.

Examples of the arylene group having a carbon atom number of from 2 to 12 represented by E include a phenylene group and a naphthylene group.

Examples of the heterocyclic ring of the 5- or 6-membered aromatic heterocyclic ring group represented by E include rings such as furan, pyrrole, pyrazole, imidazole, oxazole, thiazole, 1,2,3-oxazole, 1,2,3-triazole, 1,2,4-triazole, 1,3,4-thiadiazole, pyridine, pyridazine, pyrimidine, pyrazine, s-triazine, benzofuran, indole, benzothiophene, benzimidazole, benzothiazole, purine, quinoline, and isoquinoline.

Each of the substituents denoted in formula (I) above may further have a substituent.

The compound represented by formula (I) above can be synthesized by a known method, for example a method described in Japanese Patent No. 2509288.

Exemplified compounds of the compound represented by formula (I) will be listed below, but the present invention is not limited thereto.

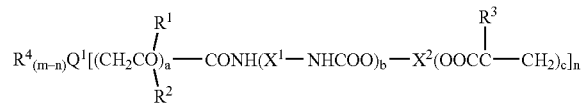
| Compound No. | R⁴ | Q¹ | m | a | R¹ | R² | b | X¹ | X² | c | R³ | n |
|---|---|---|---|---|---|---|---|---|---|---|---|---|
| I-1 | — | —N< | 3 | 1 | H | H | 0 | — | $C_2H_4$ | 1 | $CH_3$ | 3 |
| I-2 | — | —N< | 3 | 1 | $CH_3$ | H | 0 | — | $C_2H_4$ | 1 | $CH_3$ | 3 |
| I-3 | $C_2H_4OH$ | —N< | 3 | 1 | H | H | 0 | — | $C_2H_4$ | 1 | $CH_3$ | 2 |
| I-4 | — | —N< | 3 | 1 | H | H | 1 | *1 | $C_2H_4$ | 1 | $CH_3$ | 3 |
| I-5 | — | >NCH₂CH₂N< | 4 | 1 | H | H | 0 | — | $C_2H_4$ | 1 | $CH_3$ | 4 |
| I-6 | — | >NCH₂CH₂N< | 4 | 1 | $CH_3$ | H | 0 | — | $C_2H_4$ | 1 | $CH_3$ | 4 |
| I-7 | — | —N< | 3 | 1 | H | H | 0 | — | $C_3H_6$ | 1 | $CH_3$ | 3 |
| I-8 | — | >NCH₂CH₂N< | 4 | 1 | H | H | 0 | — | $C_3H_6$ | 1 | $CH_3$ | 4 |
| I-9 | — | —N< | 3 | 1 | H | H | 0 | — | $C_2H_4$ | 1 | H | 3 |
| I-10 | — | >NCH₂CH₂N< | 4 | 1 | H | H | 0 | — | $C_2H_4$ | 1 | H | 4 |
| I-11 | — | —S— | 2 | 1 | H | H | 0 | — | $C_2H_4$ | 1 | $CH_3$ | 2 |
*1: 2,2,4-trimethylhexamethylene I-12
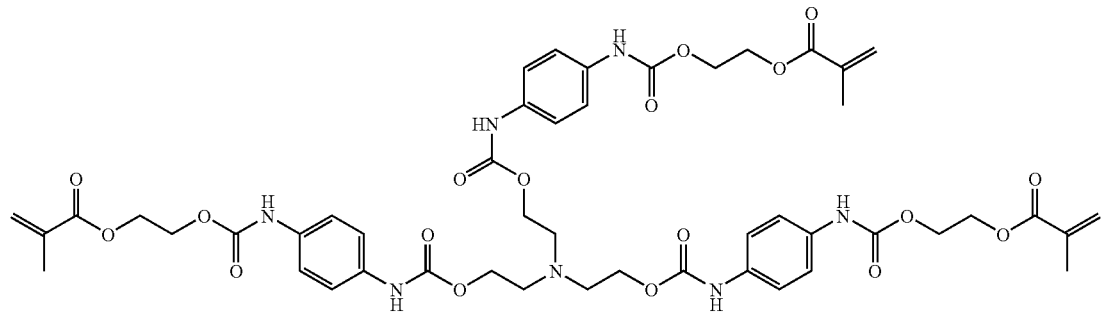
I-13
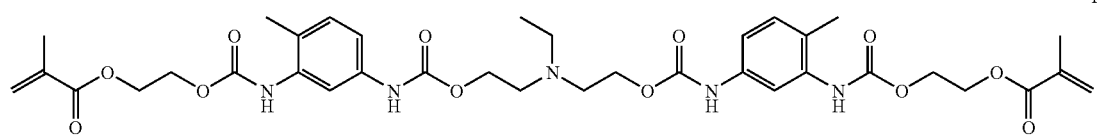
I-14
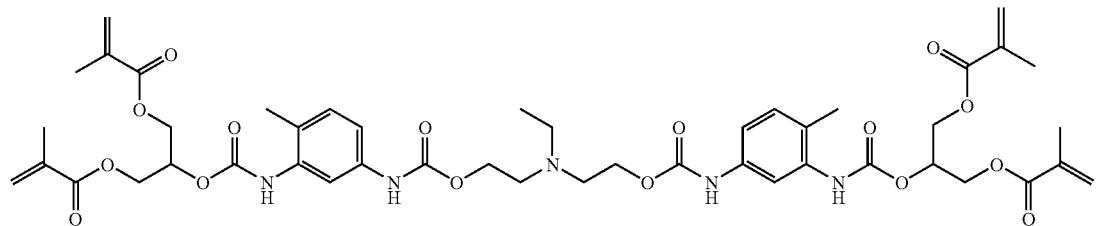
I-15
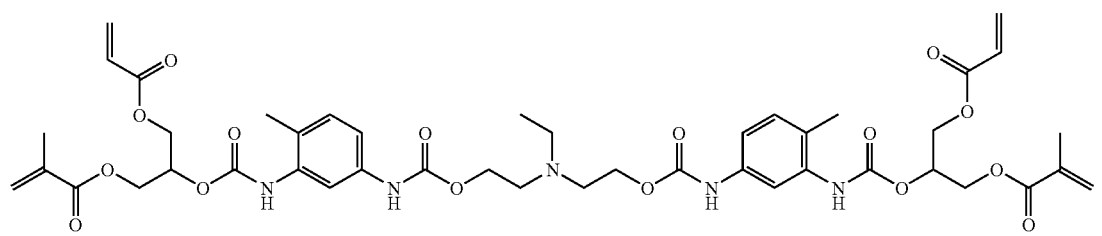
I-16
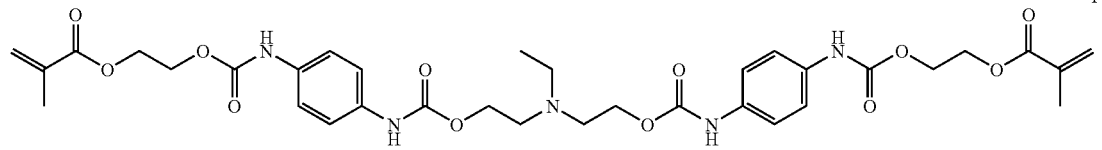
I-17
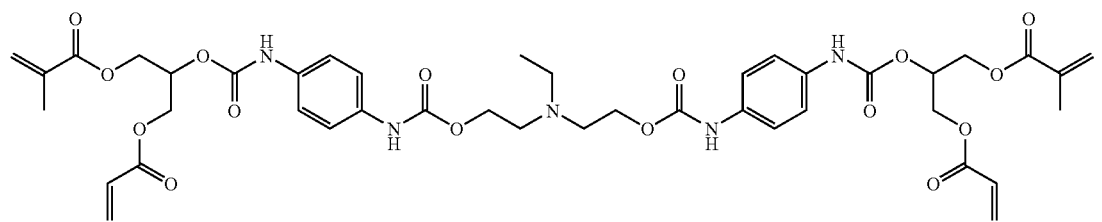

-continued
I-18
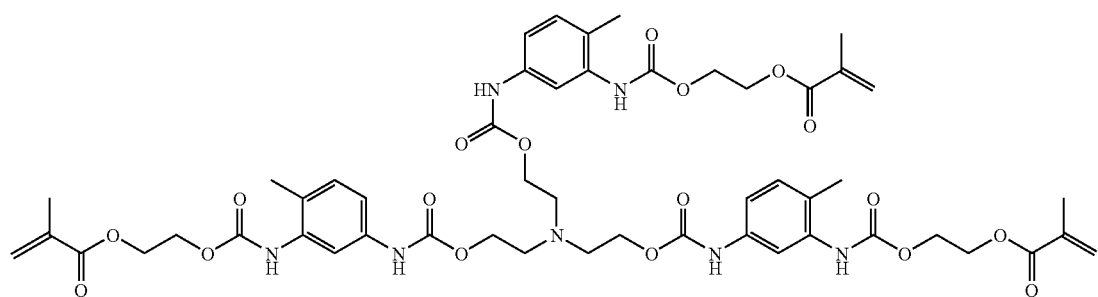
I-19
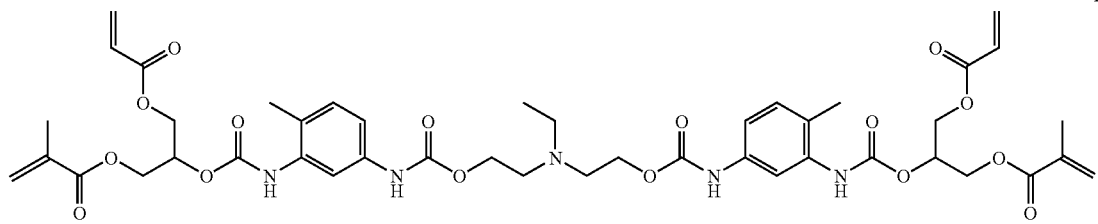
I-20
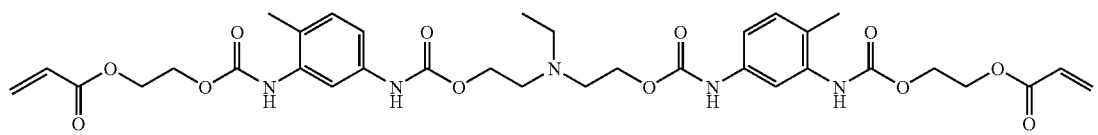
I-21
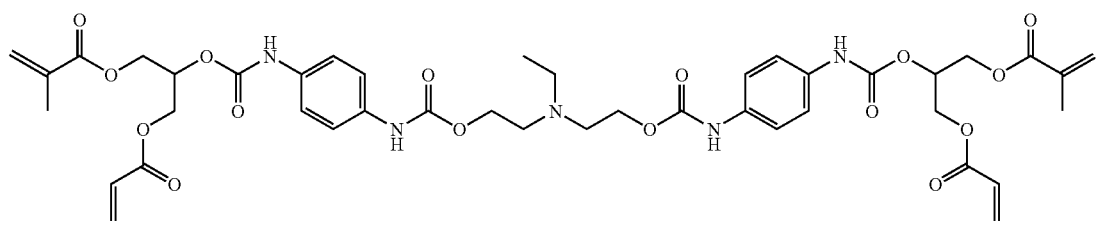
I-22
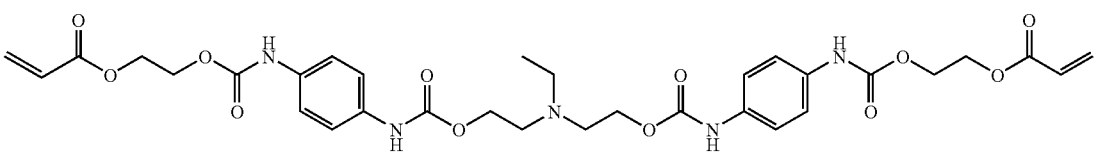
I-23
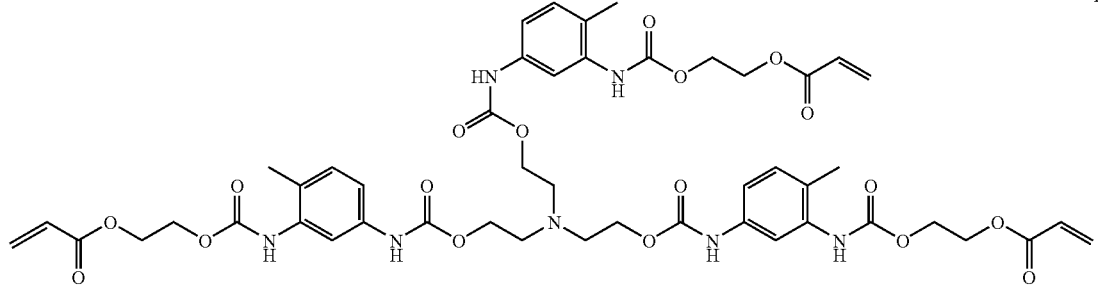

-continued
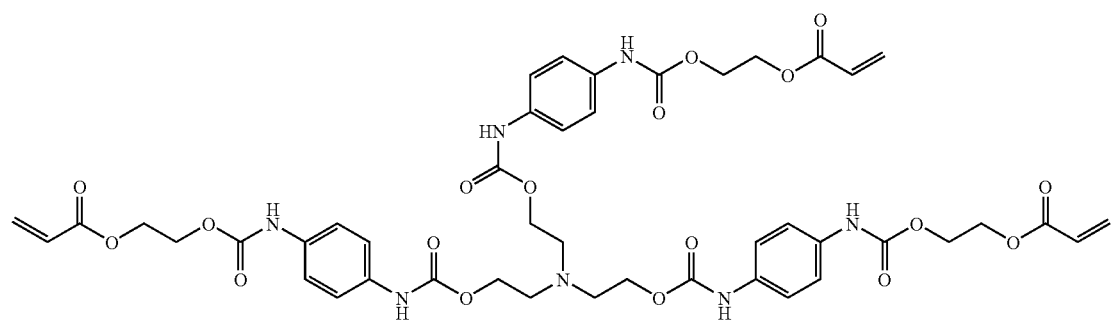
I-24
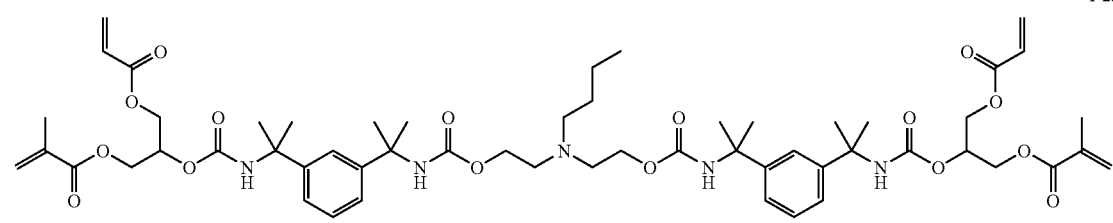
I-25
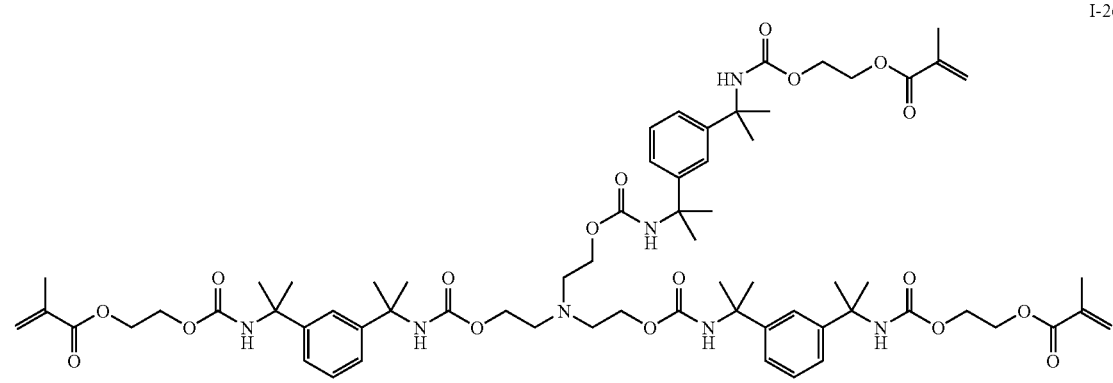
I-26
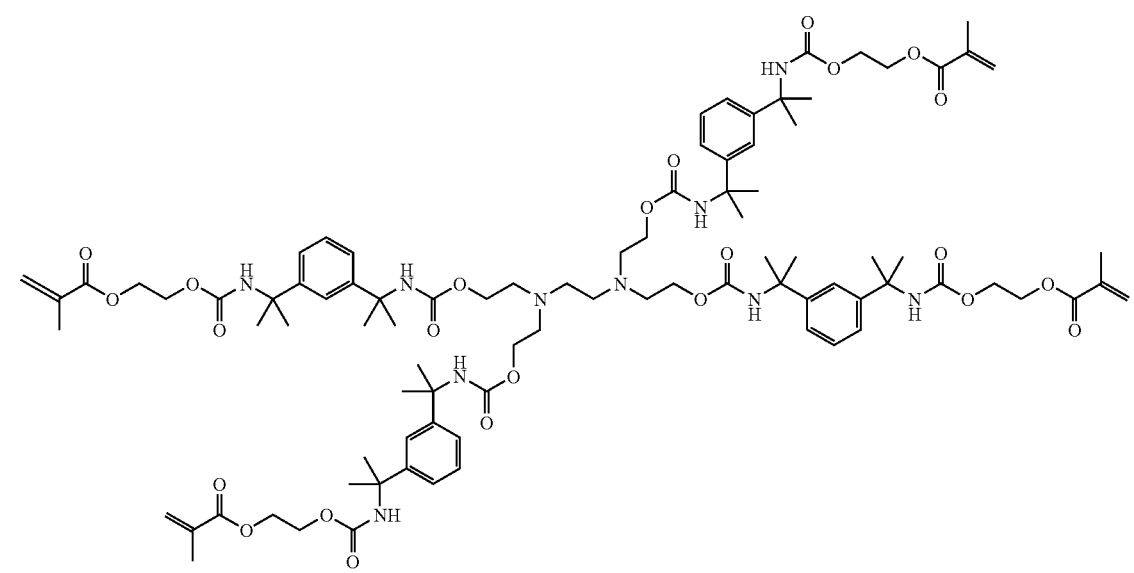
I-27

I-28

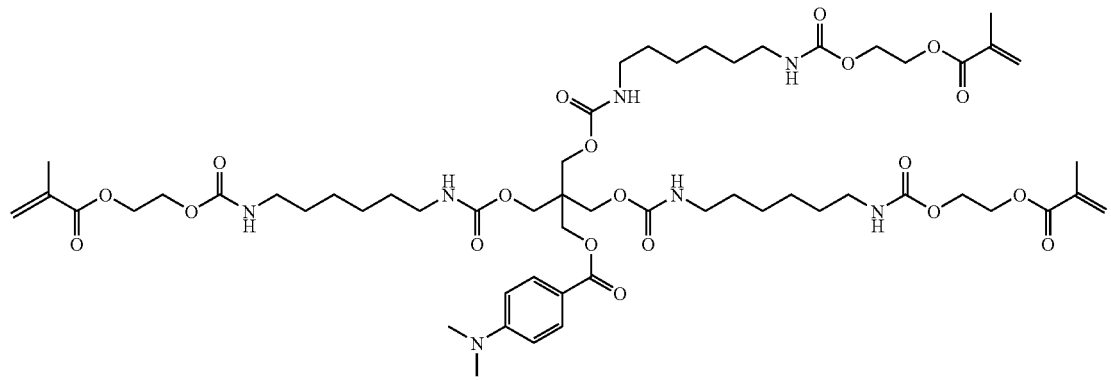

An ethylenically unsaturated compound represented by the following formula (II) is also preferred.

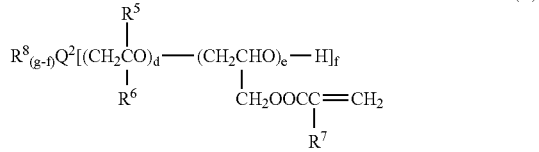
Formula (II)

wherein $Q^2$ represents

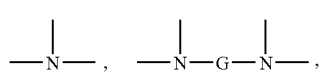

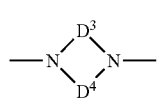

$R^8$ represents an alkyl group, a hydroxyalkyl group, or an aryl group; $R^5$ and $R^6$ independently represent a hydrogen atom, an alkyl group, or an alkoxyalkyl group; and $R^7$ represents a hydrogen atom, a methyl group, or a methyl group; $D^3$ and $D^4$ independently represent a divalent saturated hydrocarbon group having a carbon atom number of from 1 to 5; G represents a saturated hydrocarbon group having a carbon atom number of from 2 to 12, a 5- to 7-membered cycloalkylene group, an arylene group having a carbon atom number of from 6 to 12, or a 5- or 7-membered heterocyclic group; d and e independently represent an integer of from 1 to 4; g is an integer of from 2 to 4; and f is an integer of from 1 to g, provided that plural groups having the same definition may be the same or different.

In formula (II), when (g–f) is two or more, plural $R^8$'s may be the same or different. It is preferred that g and f are the same. When $R^8$ is an alkyl group, or a hydroxyalkyl group, $R^8$ has a carbon atom number of preferably from 2 to 8, more preferably from 2 to 4. When $R^8$ is an aryl group, $R^8$ is preferably monocyclic or bicyclic, and more preferably monocyclic. The aryl groups include those having a substituent such as an alkyl group, an alkoxy group or a halogen atom.

When $R^5$ and $R^6$ independently represent an alkyl group, or an alkoxy group, $R^5$ and $R^6$ independently has a carbon atom number of preferably from 1 to 5. $R^7$ is preferably a methyl group.

$D^3$ and $D^4$ may be the same or different, and $D^3$ and $D^4$ are preferably 6-member saturated heterocyclic groups having two nitrogen atoms, respectively.

When G is the saturated hydrocarbon group, G has a carbon atom number of preferably from 2 to 6. When G is the arylene group, G is preferably phenylene, when G is the cycloalkylene group, G is preferably cyclohexylene group, and when G is the heterocyclic group, G is preferably a 5- or 6-membered heterocyclic group containing a nitrogen atom or a sulfur atom.

In order to prepare a compound of formula (II) in which $Q^2$ is N, and g and f are the same, for example, glycidylacrylate or hydroxyacrylate is reacted with alkylamine. Other compounds can be prepared in the same was as above.

Exemplified compounds of the compound represented by formula (II) will be listed below.

$$R^8_{(g-f)}Q^2[(CH_2\overset{R^5}{\underset{R^6}{C}}O)_d-(CH_2CHO)_e-H]_f$$
$$\underset{\underset{R^7}{|}}{CH_2OOCC}=CH_2$$

| Compound No. | $R^8$ | $Q^2$ | g | d | $R^5$ | $R^6$ | e | $R^7$ | f |
|---|---|---|---|---|---|---|---|---|---|
| II-1 | — | —N< | 3 | 1 | H | H | 1 | $CH_3$ | 3 |
| II-2 | — | —N< | 3 | 1 | $CH_3$ | H | 1 | $CH_3$ | 3 |
| II-3 | $CH_2CH_2OH$ | —N< | 3 | 1 | H | H | 1 | $CH_3$ | 2 |
| II-4 | — | —N< | 3 | 1 | $CH_3$ | H | 1 | H | 3 |
| II-5 | — | >NCH$_2$CH$_2$N< | 4 | 1 | H | H | 1 | $CH_3$ | 4 |
| II-6 | — | >NCH$_2$CH$_2$N< | 4 | 1 | $CH_3$ | H | 1 | $CH_3$ | 4 |
| II-7 | $C_6H_5$ | —N< | 3 | 1 | H | H | 1 | H | 2 |
| II-8 | — | >NCH$_2$CH$_2$N< | 4 | 1 | $CH_3$ | H | 1 | H | 4 |
| II-9 | — | —N< | 3 | 1 | H | H | 1 | H | 3 |
| II-10 | — | >NCH$_2$CH$_2$N< | 4 | 1 | H | H | 1 | H | 4 |
| II-11 | — | —S— | 2 | 1 | H | H | 1 | $CH_3$ | 2 |
| II-12 | — | *2 | 4 | 1 | H | H | 1 | $CH_3$ | 4 |

2*

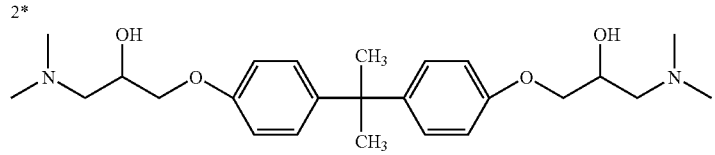

The light sensitive layer of the planographic printing plate material of the invention contains the above ethylenically unsaturated compound in an amount of preferably from 5 to 99% by weight, more preferably from 10 to 99% by weight, and still more preferably from 20 to 97% by weight.

(Binder)

As the binder used in the light sensitive layer of the planographic printing plate material of the invention, a polymer with a weight average molecular weight of from 15,000 to 500,000 and with an acid value of 30 to 200 is preferably used, which has the ethylenically unsaturated bond as contained in the ethylenically unsaturated compound described above. Known polymers having no ethylenically unsaturated bond can be used singly or in combination with the above-described polymer.

(Polymerization Initiator)

Examples of the polymerization initiator include a metallocene compound such as ferrocene or titanocene, a triarylsulfonium compound, a diaryliodonium compound, polyhalogenated compound, a bisimidazole compound, a benzoin derivative, and an N-phenylglycine derivative. In the invention, a metallocene compound or a polyhalogenated compound is preferred.

(Metallocene Compound)

The "metallocene" is a bicyclopentadienyl complex, $(C_5H_5)_2M$, which is comprised of two cyclopentadiene rings and a transition metal. Typical examples thereof include ferrocene $(C_5H_5)_2Fe$, and $(C_5H_5)_2M$, in which M is Ti, V, Cr, Mn, Co, Ni, Mo, Ru, Rh, Lu, Ta, W, Os or Ir.

The cyclopentadiene ring of the metallocene does not exhibit nonsaturability, but aromaticity like a benzene ring. The cyclopentadiene ring is susceptible to electrophilic substitution as in aromatic compounds, and can be acylated, alkylated, sulfonated or methacrylated.

Typical examples of the titanocene compound preferably used will be explained below.

Examples of the titanocene compound include those disclosed in Japanese Patent O.P.I. Publication Nos. 6341483 and 2-291. Preferred examples of the titanocene compound include bis(cyclopentadienyl)-Ti-dichloride, bis(cyclopentadienyl)-Ti-bisphenyl, bis(cyclopentadienyl)-Ti-bis-2,3,4,5,6-pentafluorophenyl, bis(cyclopentadienyl)-Ti-bis-2,3,5,6-tetrafluorophenyl, bis(cyclopentadienyl)-Ti-bis-2,4,6-trifluorophenyl, bis(cyclopentadienyl)-Ti-bis-2,6-difluorophenyl, bis(cyclopentadienyl)-Ti-bis-2,4-difluorophenyl, di-methylcyclopentadienyl-Ti-bis-2,3,4,5,6-pentafluorophenyl, bis(methylcyclopentadienyl)-Ti-bis-2,3,5,6-tetrafluorophenyl, bis(methylcyclopentadienyl)-Ti-bis-2,4-difluorophenyl (IRUGACURE 727L, produced by Ciba Specialty Co., Ltd.), bis(cyclopentadienyl)-bis(2,6-difluoro-3-(pyr-1-yl)phenyl) titanium (IRUGACURE 784, produced by Ciba Specialty Co., Ltd.), bis(cyclopentadienyl)-bis(2,4,6-trifluoro-3-(pyr-1-yl)phenyl) titanium, and bis(cyclopentadienyl)-bis(2,4,6-trifluoro-3-(2,5-dimethylpyr-1-yl)phenyl) titanium.

(Polyhalogenated Compound)

Examples of the polyhalogenated compound include carbon tetrachloride, phenyltribromomethylphenyl sulfone, phenyl trichloromethyl ketone, and compounds described in Japanese Patent O.P.I. Publication No. 53-133428, Japanese Patent Publication Nos. 57-1819 and 57-6096, and U.S. Pat. No. 3,615,455. Of these, polyhalomethylsulfone, polyhalomethyloxazole, or a polyhaloacetyl compound is preferred.

As the polyhaloacetyl compound, polyhaloacetylamide compound is preferred. For example, a polyhaloacetyl compound represented by formula (2) and preferably a compound (polyhaloacetylamide compound) represented by formula (3) are cited.

$$R^{21}-CX_2-(C=O)-R^{22} \qquad \text{Formula (2)}$$

wherein $R^{21}$ represents a hydrogen atom, a chlorine atom, a bromine atom, an alkyl group, an aryl group, an acyl group, an alkylsulfonyl group, an arylsulfonyl group or a cyano group; $R^{22}$ represents a hydrogen atom or a monovalent substituent, provided that $R^{21}$ and $R^{22}$ may combine with each other to form a ring; and X represents a chlorine atom or a bromine atom.

$$CX_3-(C=O)-Y-R^{23} \qquad \text{Formula (3)}$$

wherein $R^{23}$ represents a monovalent substituent; Y represents —O— or —$NR^{24}$—, in which $R^{24}$ represents a hydrogen atom or an alkyl group, provided that $R^{23}$ and $R^{24}$ may combine with each other to form a ring; and X represents a chlorine atom or a bromine atom.

Typical examples of the compound represented by formula (2) or (3) will be listed below, but the invention is not limited thereto.

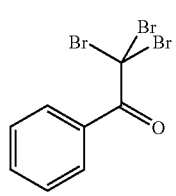

BR1

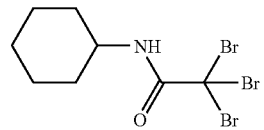

BR2

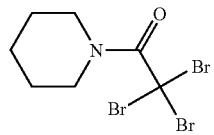

BR3

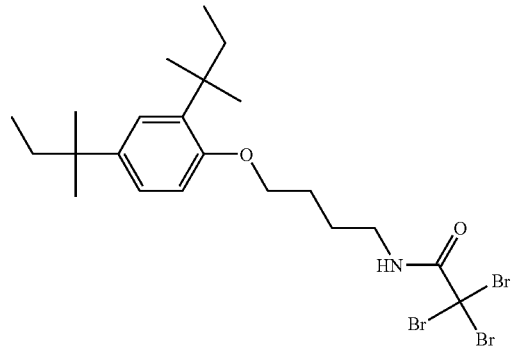

BR4

-continued
BR5 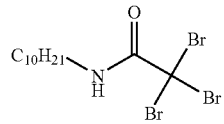  BR6 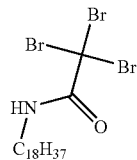
BR7 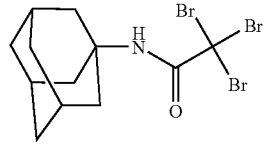  BR8 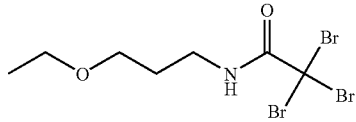
BR9 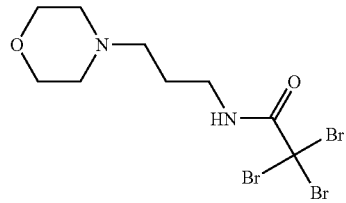  BR10 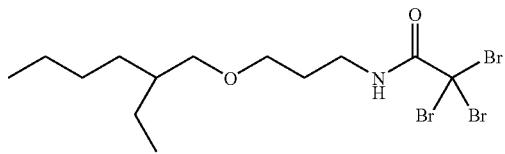
BR11   BR12 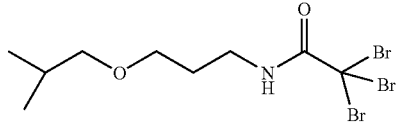
BR13   BR14 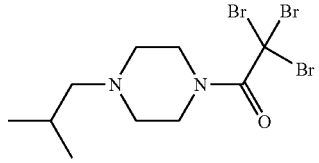
BR15 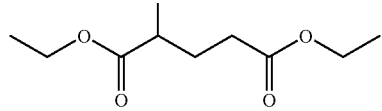  BR16 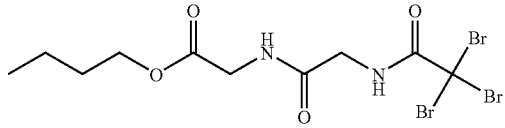
BR17 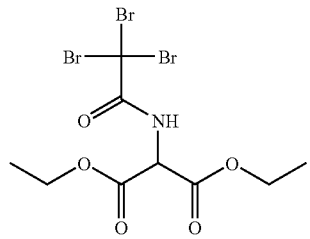  BR18 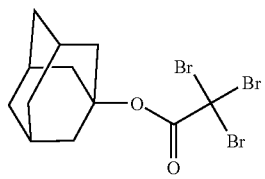
BR19 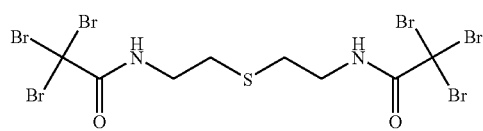  BR20 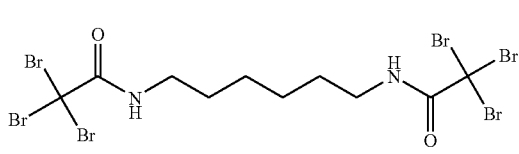

-continued
BR21
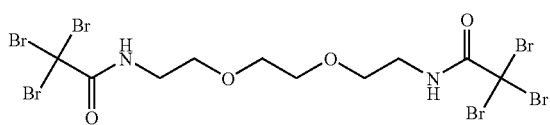
BR22
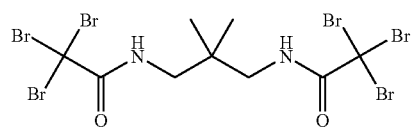
BR23
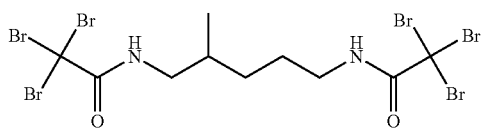
BR24
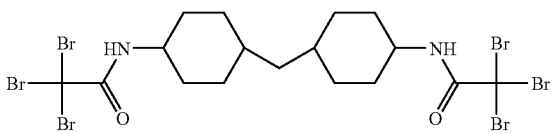
BR25
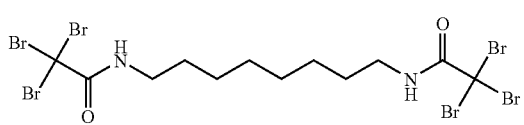
BR26
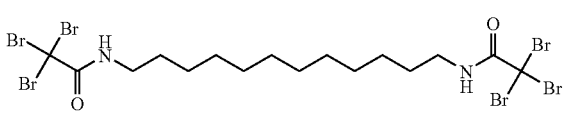
BR27
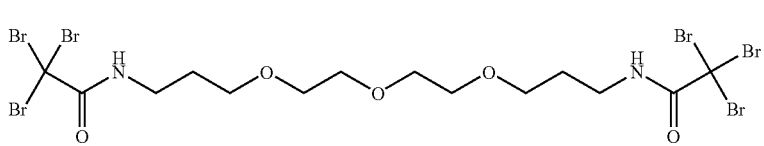
BR28
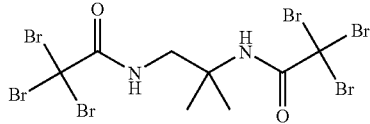
BR29
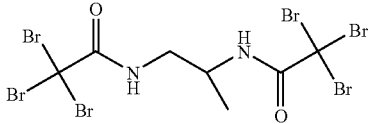
BR30
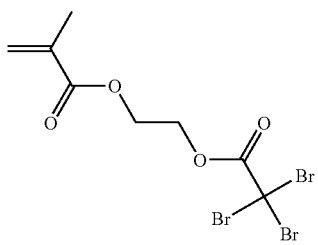
BR31
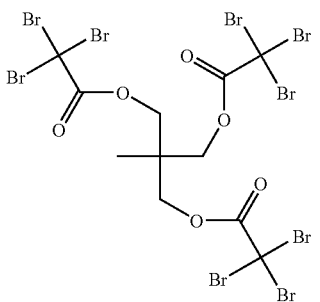
BR32
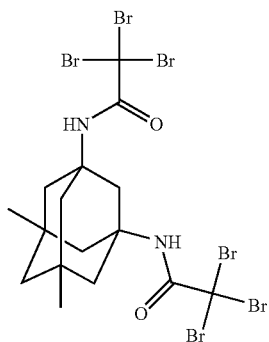
BR33
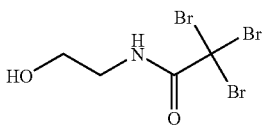

-continued
BR34
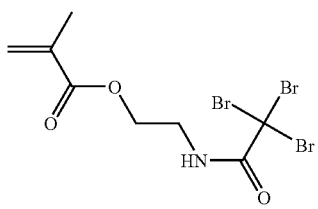
BR35
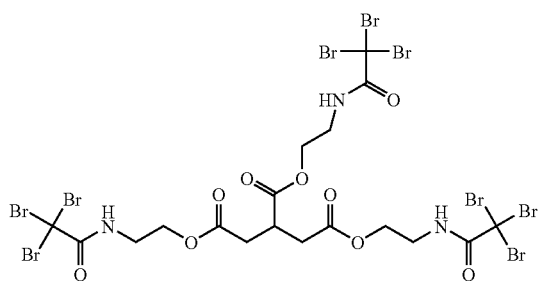
BR36
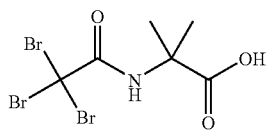
BR37
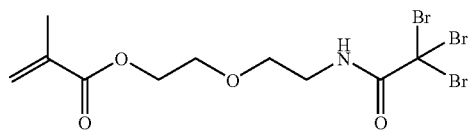
BR38
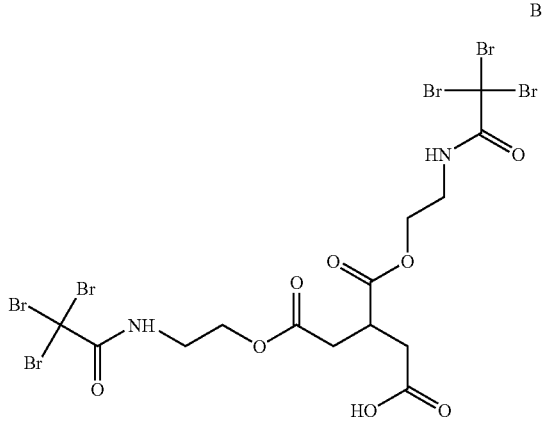
BR39
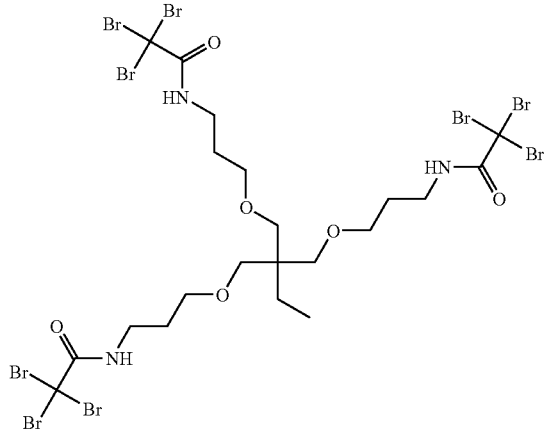
BR40
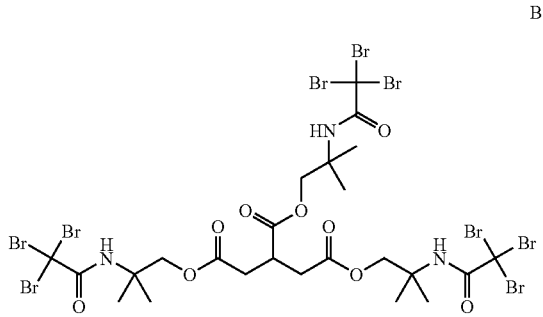
BR41
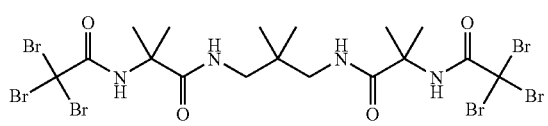

-continued
BR42
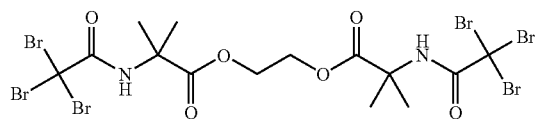
BR43
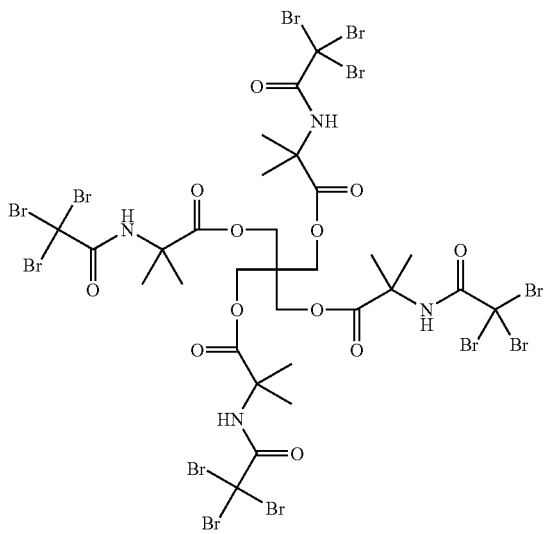
BR44
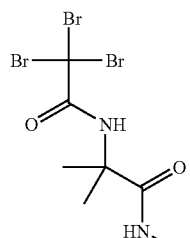
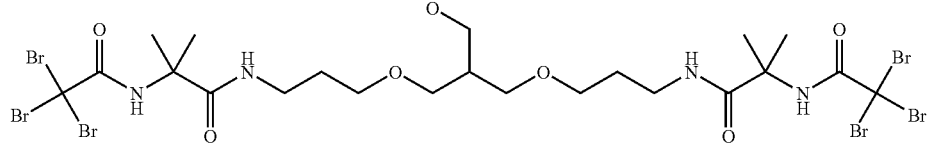
BR45
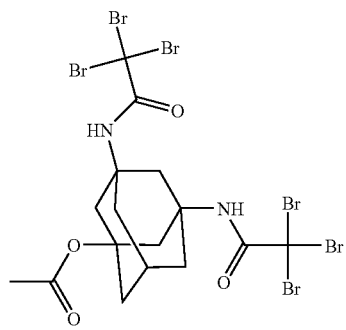
BR46
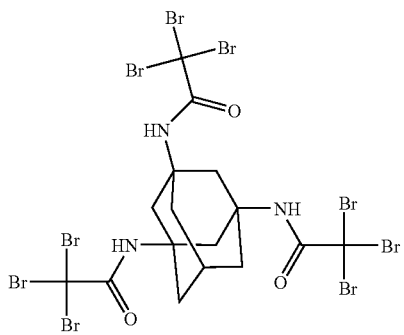
BR47
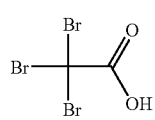
BR48
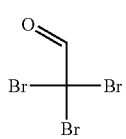

-continued
BR49 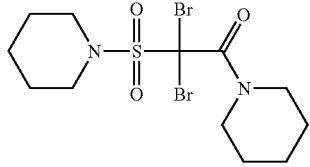 BR50 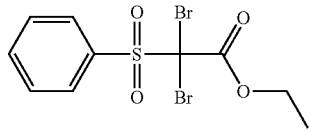
BR51 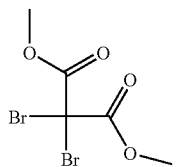 BR52 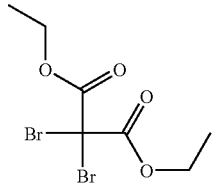
BR53 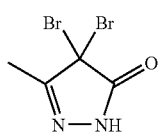 BR54 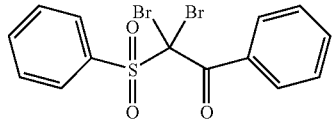
BR55 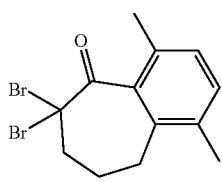 BR56 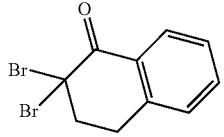
BR57 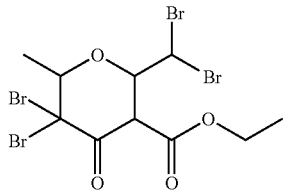 BR58 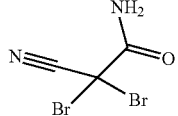
BR59 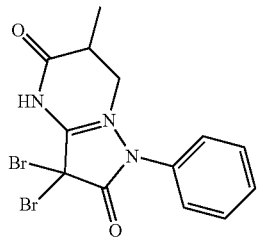 BR60 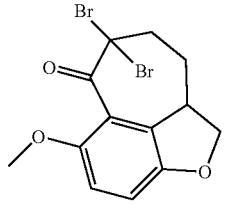
BR61 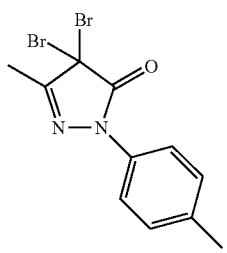 BR62 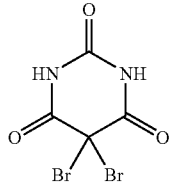
BR63 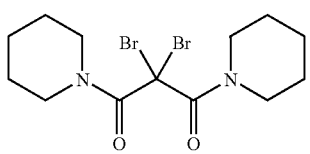 BR64 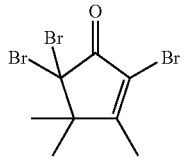

-continued
BR65 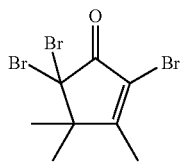 BR66
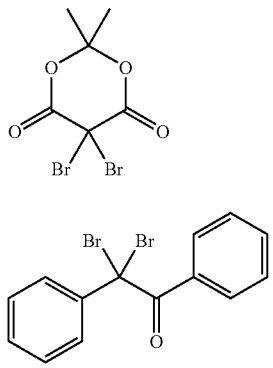
BR67 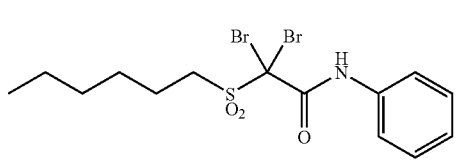 BR68
BR69 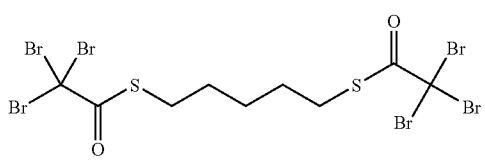 BR70
BR71 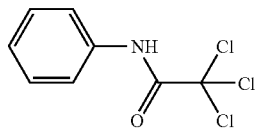 CL1
CL2 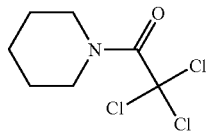 CL3
CL4 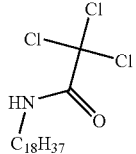 CL5
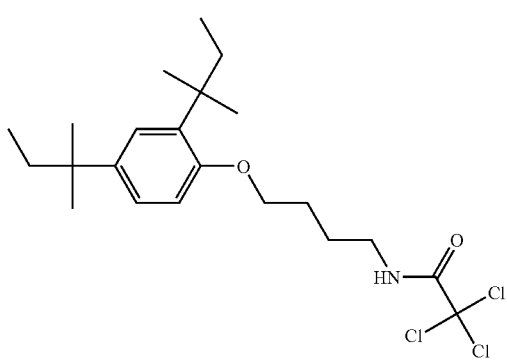
CL6 CL7
CL8 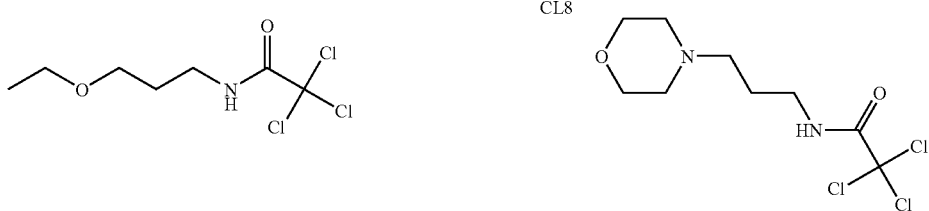 CL9

-continued
CL10
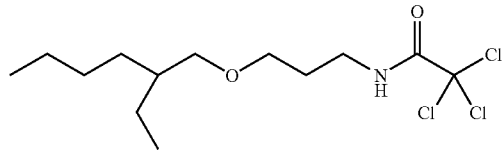
CL11
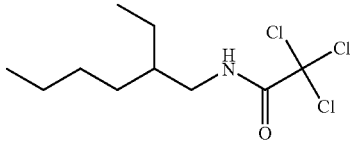
CL12
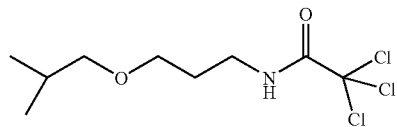
CL13
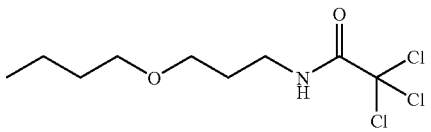
CL14
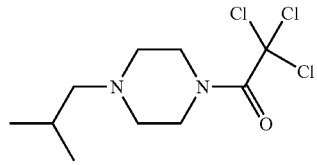
CL15
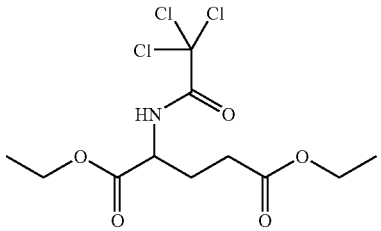
CL16
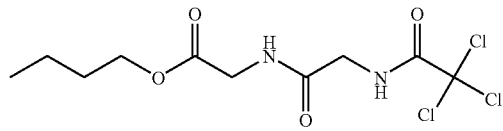
CL17
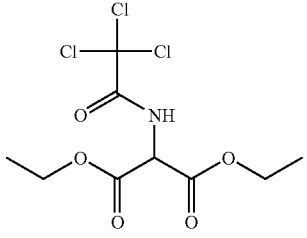
CL18
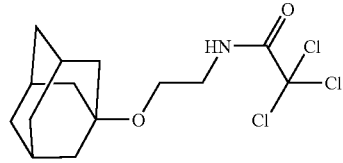
CL19
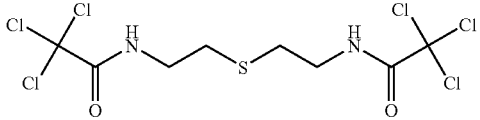
CL20
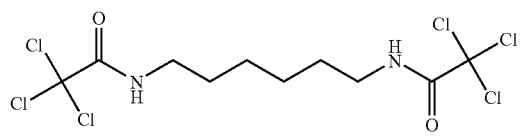
CL21
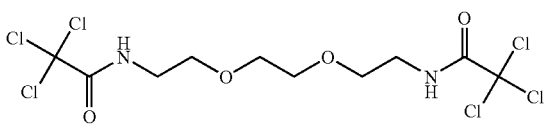
CL22
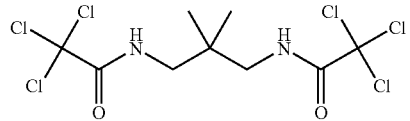
CL23
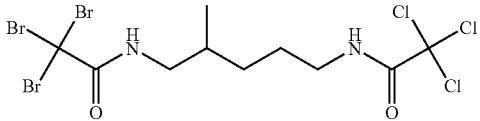
CL24
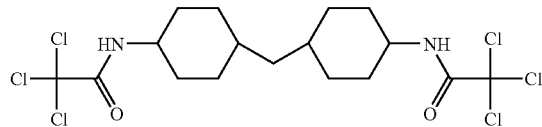
CL25
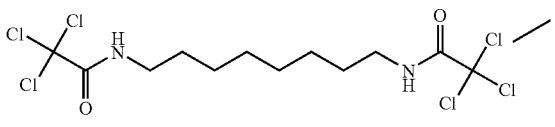
CL26
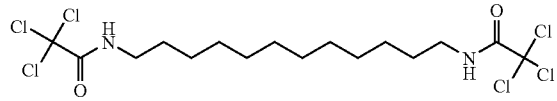

-continued
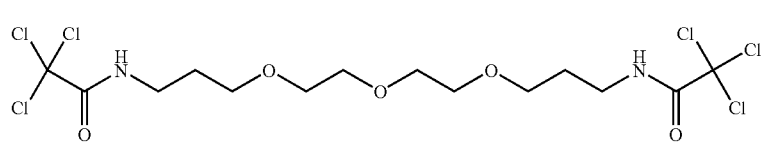
CL27
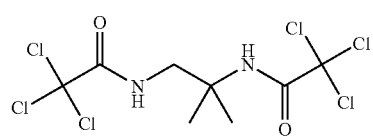
CL28
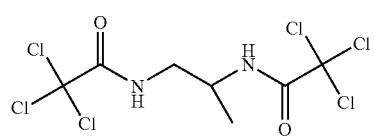
CL29
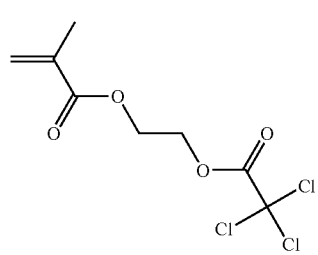
CL30
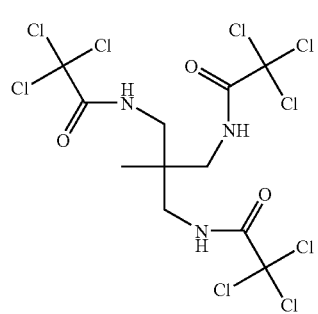
CL31
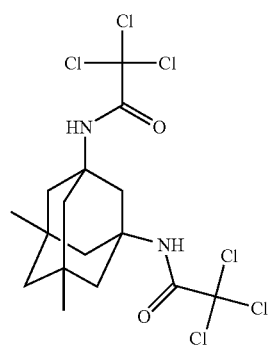
CL32
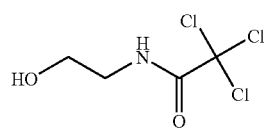
CL33
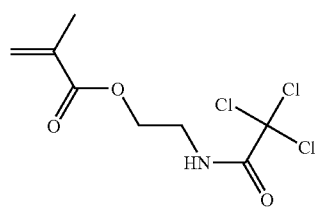
CL34
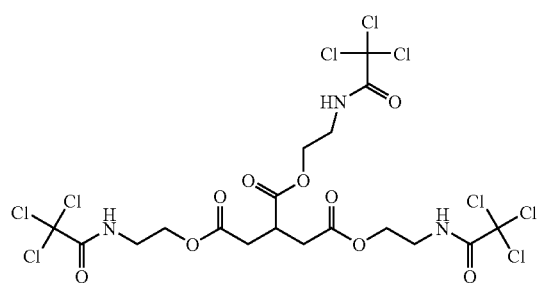
CL35
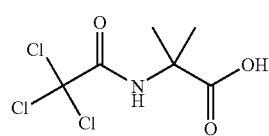
CL36
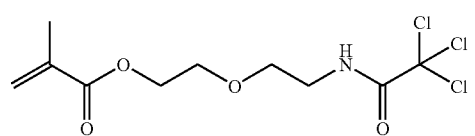
CL37

-continued
CL38
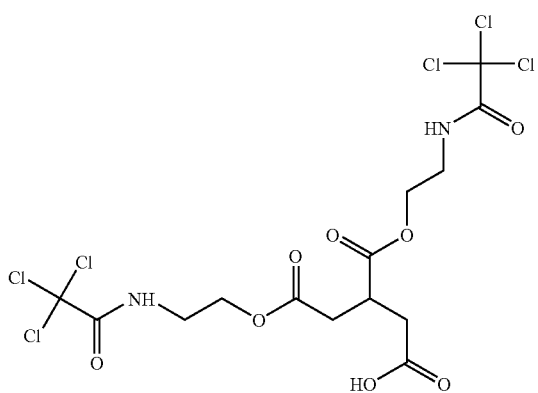
CL39
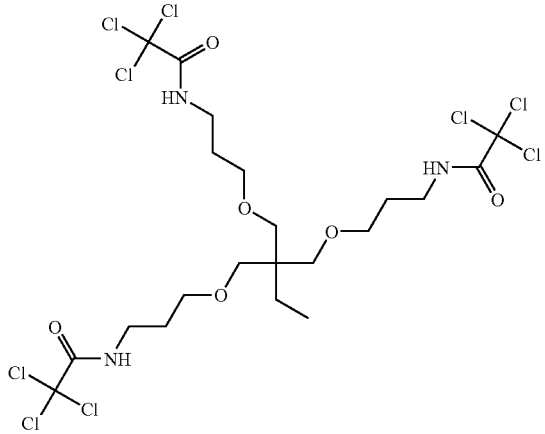
CL40
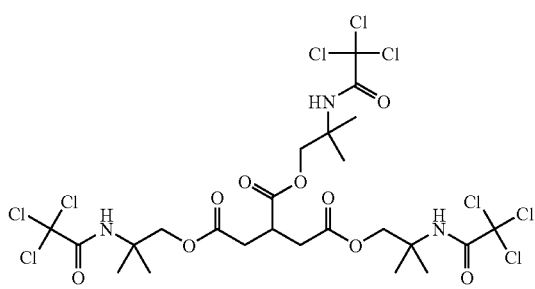
CL41
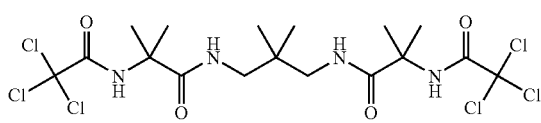
CL42
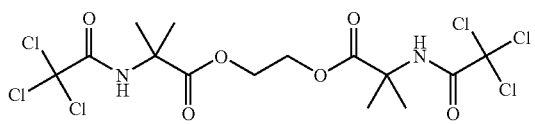
CL43
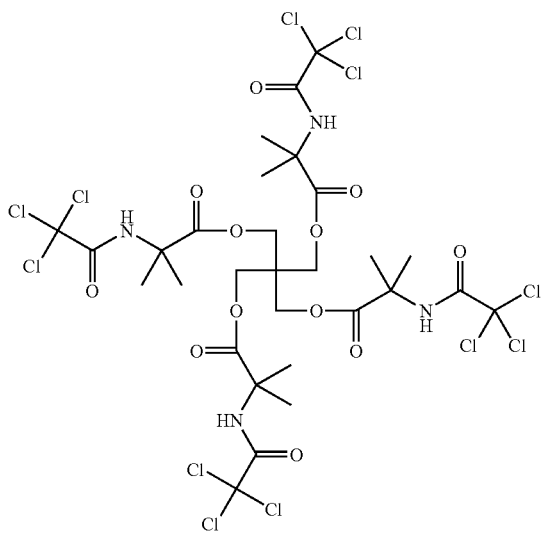

-continued

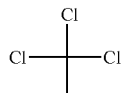

CL44

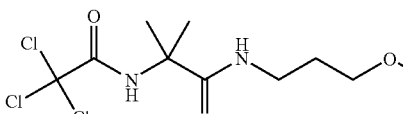

CL45

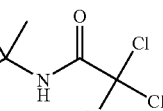

CL46

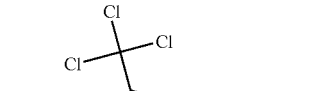

CL47

CL48

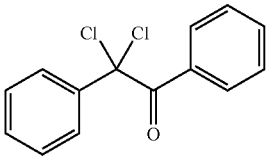

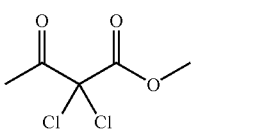

CL49

CL50

Typical synthesis method of the photopolymerization initiator in the invention represented by formula (2) is one in which alcohols, phenols or amines are esterified or amidated with acid chlorides such as tribromoacetic acid chloride, diibromoacetic acid chloride, trichlorooacetic acid chloride, or dichloroacetic acid chloride.

The alcohols, phenols or amines used above are arbitrary, and examples thereof include monohydric alcohols such as ethanol, 2-butanol, and 1-adamantanol; polyhydric alcohols such as diethylene glycol, trimethylol propane, and dipentaerythritol; phenols such as phenol, pyrogallol, and naphthol; monoamines such as morpholine, aniline, and 1-aminodecane; and polyamines such as 2,2-dimethylpropylenediamine, and 1,12-dodecanediamine.

The content of the compound of formula (2) in the light sensitive layer is not specifically limited, but is preferably from 0.1 to 20% by weight, and more preferably from 0.8 to 15% by weight. In the invention, another polymerization initiator (hereinafter also referred to as co-initiator) can be used together with the compound of formula (2).

Examples of the co-initiator include radical generating compounds disclosed in Japanese Patent Publication No. 2002-537419, polymerization initiators disclosed in Japanese Patent O.P.I. Publication Nos. 2001-175006, 2002-278057, and 2003-5363, onium salts having two or more cation portions in the molecule disclosed in Japanese Patent O.P.I. Publication No. 2003-76010, N-nitroso amine compounds disclosed in Japanese Patent O.P.I. Publication No. 2001-133966, thermally radical generating compounds disclosed in Japanese Patent O.P.I. Publication No. 2001-343742, compounds of generating a radical or an acid by heat disclosed in Japanese Patent O.P.I. Publication No. 2002-6482, borate compounds disclosed in Japanese Patent O.P.I. Publication No. 2002-116539, compounds of generating a radical or an acid by heat disclosed in Japanese Patent O.P.I. Publication No. 2002-148790, photopolymerization initiators or thermal polymerization initiators each having a polymerizable unsaturated group disclosed in Japanese Patent O.P.I. Publication No. 2002-207293, onium salts having, as a counter ion, a divalent or more valent anion disclosed in Japanese Patent O.P.I. Publication No. 2002-268217, sulfonylsulfone compounds having a specific structure disclosed in Japanese Patent O.P.I. Publication No. 2002-328465, and thermally radical generating compounds disclosed in Japanese Patent O.P.I. Publication No. 2002-341519.

The co-initiator is preferably a triarylsulfonium compound, a diaryliodonium compound, a trihalomethyltriazine compound, a bisimidazole compound, an acylphosphinoxide, a benzoin derivative, and an N-phenylglycine derivative, but the invention is not specifically limited thereto. Exemplified compounds thereof will be listed below.

Cl-1

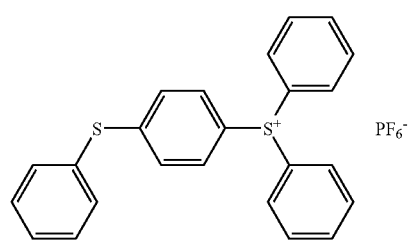

Cl-2

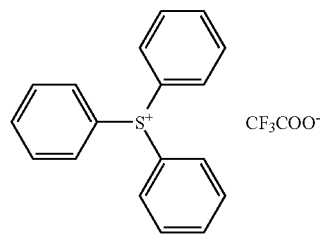

Cl-3

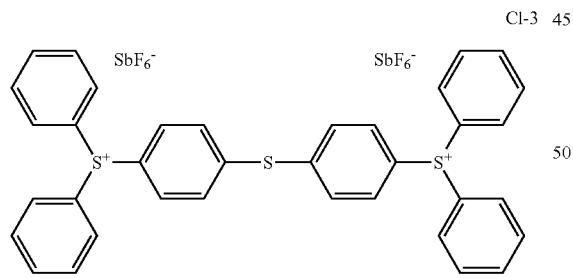

Cl-4

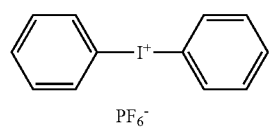

Cl-5

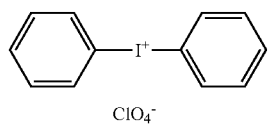

Cl-6

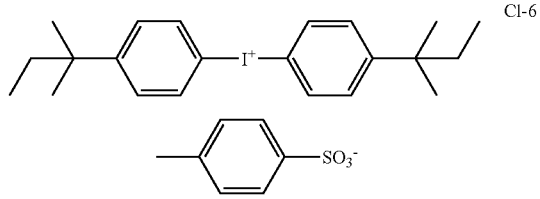

Cl-7

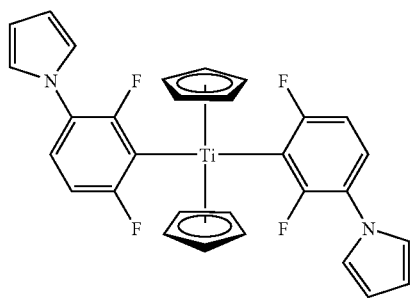

Cl-8

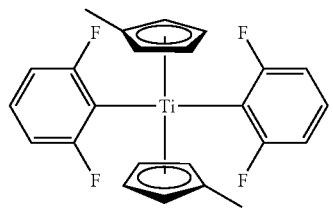

Cl-9

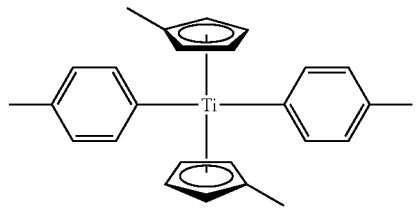

Cl-10

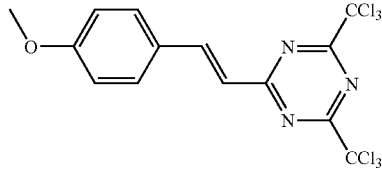

Cl-11

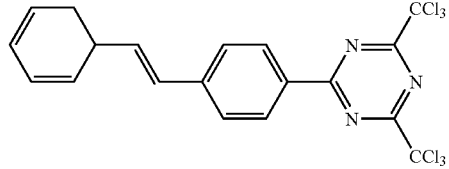

Cl-12

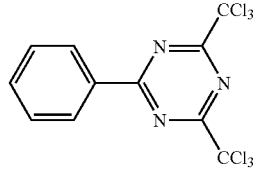

-continued

Cl-13

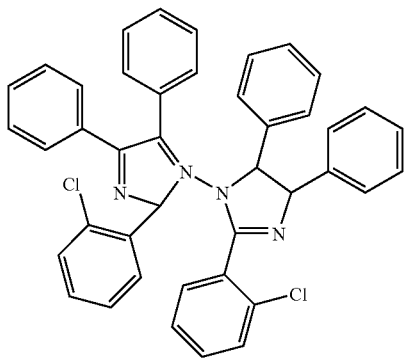

Cl-14

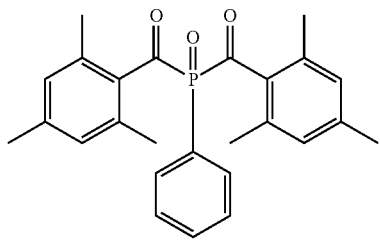

Cl-15

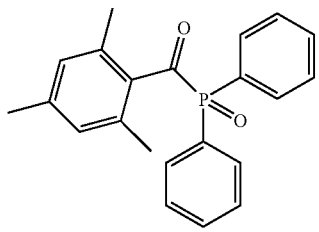

Cl-16

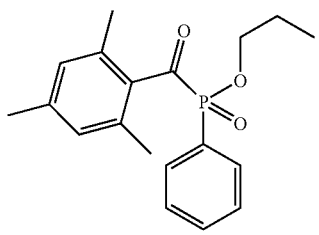

Cl-17

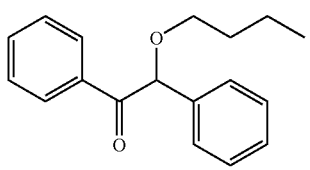

Cl-18

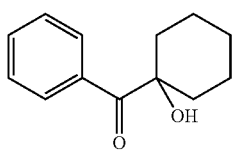

Cl-19

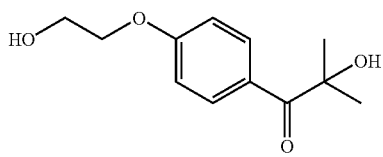

-continued

Cl-20

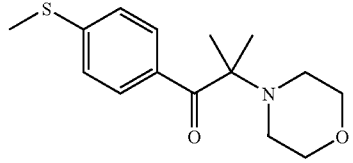

Cl-21

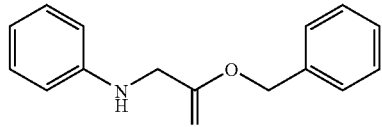

Cl-22

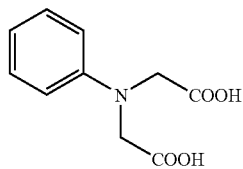

Cl-23

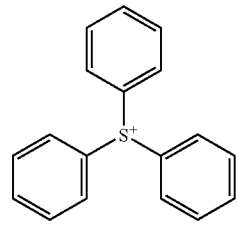

Cl-24

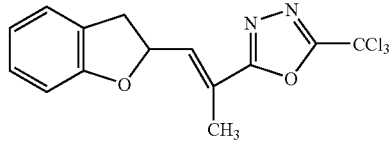

The content of the polymerization initiator other than the polymerization initiator in the invention in the light sensitive layer is not specifically limited, but is preferably from 0.1 to 20% by weight, and more preferably from 0.8 to 15% by weight.

(Sensitizing Dye)

When laser is used as a light source, the light sensitive layer in the invention preferably contains a sensitizing dye. A dye having absorption maximum approximate to the emission wavelength of light of the light source is preferred.

Examples of dyes capable of sensitizing to visible to near infrared wavelength regions include cyanine, phthalocyanine, merocyanine, oxonol, porphyrin, a spiro compound, ferrocene, fluorene, fulgide, imidazole, perylene, phenazine, phenothiazine, polyene, an azo compound, diphenylmethane, triphenylmethane, polymethine acridine, cumarin, cumarin derivatives, ketocumarin, quinacridone, indigo, styryl, pyrylium compounds, pyrromethene compounds, pyrazolotriazole compounds, benzothiazole compounds, barbituric acid derivatives, thiobarbituric acid derivatives, ketoalcohol borate complexes, and compound disclosed in EP 568,993, U.S. Pat. Nos. 4,508,811 and 5,227,277, and Japanese Patent O.P.I. Publication Nos. 2001-125255 and 11-271969. Among these, dyes having a skeleton of cumarin, ketocumarin, oxonol, barbituric acid, pyrromethene borate or diphenylmethane are preferred.

The content ratio of the polymerization initiator to the sensitizing dye is from 1:100 to 100:1.

When recording is carried out employing a semiconductor laser called a violet laser emitting light with an emission wavelength of from 390 to 430 nm, a dye having absorption maximum in the range of from 390 to 430 nm is preferably used. The dye having absorption maximum in the range of from 390 to 430 nm has is not specifically limited to the chemical structure, as long as they have the characteristics as described above. Examples thereof include dyes disclosed in Japanese Patent O.P.I. Publication Nos. 2002-296764, 2002-268239, 2002-268238, 2002-268204, 2002-221790, 2002-202598, 2001-42524, 2000-309724, 2000-258910, 2000-206690, 2000-247763, and 2000-98605, but are not limited thereto.

<Overcoat Layer>

In the invention, an overcoat layer (protective layer) is preferably provided on the light sensitive layer. It is preferred that the protective layer is highly soluble in the developer as described later (generally an alkaline solution). Polyvinyl alcohol or polyvinyl pyrrolidone is preferably used in the protective layer. Polyvinyl alcohol has the effect of preventing oxygen from transmitting and polyvinyl pyrrolidone has the effect of increasing adhesion between the oxygen shielding layer and the light sensitive layer.

Besides the above two polymers, the oxygen shielding layer may contain a water soluble polymer such as polysaccharide, polyethylene glycol, gelatin, glue, casein, hydroxyethyl cellulose, carboxymethyl cellulose, methyl cellulose, hydroxyethyl starch, gum arabic, sucrose octacetate, ammonium alginate, sodium alginate, polyvinyl amine, polyethylene oxide, polystyrene sulfonic acid, polyacrylic acid, or a water soluble polyamide.

In the planographic printing plate material in the invention, adhesive strength between the protective layer and the light sensitive layer is preferably not less than 35 mN/mm, more preferably not less than 50 mN/mm, and still more preferably not less than 75 mN/mm. Preferred composition of the protective layer is disclosed in Japanese Patent O.P.I. Publication No. 10-10742. The adhesive force is defined as follows. When an adhesive tape with a given width and with a sufficient adhesion is adhered onto the protective layer, and then peeled off from the protective layer surface together with the protective layer in the direction perpendicular to the protective layer, force necessary to peel off the adhesive tape is defined as adhesive force.

The protective layer may further contain a surfactant or a matting agent. The protective layer is formed, coating on the photopolymerizable light sensitive layer a coating solution in which the above protective layer composition is dissolved in an appropriate coating solvent, and drying. The main solvent of the coating solution is preferably water or an alcohol solvent such as methanol, ethanol, or isopropanol. The thickness of the protective layer is preferably 0.1 to 5.0 μm, and more preferably 0.5 to 3.0 μm.

<Hydrophilic Support>

As the supports used in the invention, a plate of a metal such as aluminum, stainless steel, chromium or nickel having hydrophilicity, or a plastic film such as a polyester film, a polyethylene film or a polypropylene film, which is deposited or laminated with the above-described metal can be used. Further, a polyester film, a polyvinyl chloride film or a nylon film whose surface is subjected to hydrophilization treatment can be used. Among the above, the aluminum plate is preferably used, and may be a pure aluminum plate or an aluminum alloy plate.

As the aluminum alloy, there can be used various ones including an alloy of aluminum and a metal such as silicon, copper, manganese, magnesium, chromium, zinc, lead, bismuth, nickel, titanium, sodium or iron.

It is preferable that the support in the invention is subjected to degreasing treatment for removing rolling oil prior to surface roughening (graining). The degreasing treatments include degreasing treatment employing solvents such as trichlene and thinner, and an emulsion degreasing treatment employing an emulsion such as kerosene or triethanol. It is also possible to use an aqueous alkali solution such as caustic soda for the degreasing treatment. When an aqueous alkali solution such as caustic soda is used for the degreasing treatment, it is possible to remove soils and an oxidized film which can not be removed by the above-mentioned degreasing treatment alone. When an aqueous alkali solution such as caustic soda is used for the degreasing treatment, the resulting support is preferably subjected to desmut treatment in an aqueous solution of an acid such as phosphoric acid, nitric acid, sulfuric acid, chromic acid, or a mixture thereof, since smut is produced on the surface of the support. The surface roughening methods include a mechanical surface roughening method and an electrolytic surface roughening method electrolytically etching the support surface.

(Coating)

In the invention, a planographic printing plate material can be obtained by preparing a light sensitive composition (light sensitive coating liquid), coating the liquid on the support according to a coating conventional method, and drying. Examples of the coating method include an air doctor coating method, a blade coating method, a wire bar coating method, a knife coating method, a dip coating method, a reverse roll coating method, a gravure coating method, a cast coating method, a curtain coating method, and an extrusion coating method.

A low drying temperature of the coated light sensitive layer cannot provide sufficient printing durability, while too a high drying temperature of the coated light sensitive layer results in marangoni and produces fog at non-image portions. The drying temperature is preferably from 60 to 160° C., more preferably from 80 to 140° C., and still more preferably from 90 to 120° C.

(Image Formation Method)

The light sources for forming an image on the planographic printing plate material of the invention include, for example, a laser, an emission diode, a xenon flush lamp, a halogen lamp, a carbon arc light, a metal halide lamp, a tungsten lamp, a high pressure mercury lamp, and a non-electrode light source.

When the planographic printing plate material is image-wise exposed at one time, a mask having a negative image pattern made of a light shielding material is put on the plate to be in close contact with the plate material, and exposure is carried out through the mask.

When an array light such as an emission diode array is used or exposure using a halogen lamp, a metal halide lamp or a tungsten lamp is controlled using an optical shutter material such as liquid crystal or PLZT, a digital exposure according to an image signal is possible and preferable. In this case, direct writing is possible without using any mask material.

When a laser is used for exposure, which can be condensed in the beam form, scanning exposure according to an image can be carried out, and direct writing is possible without using any mask material. When the laser is employed for imagewise exposure, a highly dissolved image can be obtained, since it is easy to condense its exposure spot in minute size.

As the laser, argon laser, He—Ne gas laser, YAG laser or semi-conductor laser is preferably used. In the invention, a semiconductor laser employing InGaN type material or ZnSn type material, which can continuously emit light with a wavelength of from 380 to 430 nm, is especially preferred in view of obtaining the effects of the invention.

As a laser scanning method by means of a laser beam, there are a method of scanning on an outer surface of a cylinder, a method of scanning on an inner surface of a cylinder and a method of scanning on a plane. In the method of scanning on an outer surface of a cylinder, laser beam exposure is conducted while a drum around which a recording material is wound is rotated, in which main scanning is represented by the rotation of the drum, while sub-scanning is represented by the movement of the laser beam. In the method of scanning on an inner surface of a cylinder, a recording material is fixed on the inner surface of a drum, a laser beam is emitted from the inside, and main scanning is carried out in the circumferential direction by rotating a part of or an entire part of an optical system, while sub-scanning is carried out in the axial direction by moving straight a part of or an entire part of the optical system in parallel with a shaft of the drum. In the method of scanning on a plane, main scanning by means of a laser beam is carried out through a combination of a polygon mirror, a galvano mirror and an Fθ lens, and sub-scanning is carried out by moving a recording medium. The method of scanning on an outer surface of a cylinder and the method of scanning on an inner surface of a cylinder are suitable for high density image recording, since it is easier to increase accuracy of an optical system.

(Development)

In the invention, the imagewise exposed light sensitive layer, which are cured are at exposed portions, is developed with an alkali developer, whereby the light sensitive layer at exposed portions are removed to form an image. As the alkali developer, a conventional alkali aqueous solution is used. For example, there is an alkali developer containing an inorganic alkali agent such as sodium silicate, potassium silicate, ammonium silicate, sodium secondary phosphate, potassium secondary phosphate, ammonium secondary phosphate; sodium hydrogen carbonate, potassium hydrogen carbonate, ammonium hydrogen carbonate; sodium carbonate, potassium carbonate, ammonium carbonate; sodium borate, potassium borate, lithium borate; sodium hydroxide, potassium hydroxide, and ammonium hydroxide.

The alkali developer can contain organic alkali agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, and pyridine.

These alkali agents can be used singly or as a mixture of two or more thereof. The alkali developer can contain an anionic surfactant, an amphoteric surfactant, or an organic solvent such as alcohol.

The developer used in the invention has preferably an aqueous alkali solution having a pH of more than 8.5 to less than 13.0, and more preferably 10.0 to 12.5. The developer has an electric conductivity of preferably from 3 to 30 mS/cm. Electric conductivity lower than the foregoing range usually renders difficult dissolution of the light sensitive layer provided on the surface of an aluminum plate support, leading to stained printing. While an electric conductivity exceeding the foregoing range results in an increased salt concentration, retarding dissolution of the light sensitive layer, resulting in residual layer at unexposed areas. The electric conductivity is more preferably from 5 to 20 mS/cm.

The developer or developer replenisher can contain a surfactant in order to accelerate development, disperse the development scum, or enhance ink receptivity of the image portions of the printing plate.

The preferred surfactant is an anionic surfactant, a cationic surfactant, a nonionic surfactant, or an amphoteric surfactant. In the invention, a nonionic surfactant having a polyoxyalkylene ether group is especially preferred. Examples of this type of nonionic surfactant include polyoxyethylenealkyl ether, polyoxyethylenearyl ether, polyoxyethylenealkyl phenyl ether, polyoxyethylenealkyl naphthyl ether, polyoxyethylenepolyoxypropylenealkyl ether, and so on.

EXAMPLES

Next, the present invention will be explained in the following examples, but the present invention is not limited thereto. In the examples, "parts" represents "parts by weight", and "%" represents "% by weight", unless otherwise specified.

Example 1

<Synthesis of Polymer Binder>

Methyl methacrylate of 58.0 parts (0.58 mol), 35.0 parts (0.41 mol) of methacrylic acid, 6.0 parts (0.05 mol), of ethyl methacrylate, 100 parts of ethanol, and 1.23 parts of α,α'-azobisisobutyronitrile were put in a three neck flask under nitrogen atmosphere, and reacted under nitrogen atmosphere for 6 hours at 80° C. in an oil bath. After that, the reaction mixture was added with 1 part of triethylbenzylammonium chloride and 28.0 parts (0.2 mol) of glycidyl methacrylate (epoxy-containing unsaturated compound) and reacted at 25° C. for additional 3 hours. Thus, polymer binder A was obtained. The weight average molecular weight of the polymer binder A was 70,000, measured according to GPC.

Polymer binders B and C were prepared in the same manner as in Polymer binder A, except that a mixture ratio pf monomers, and an addition amount of the epoxy compound for reacting with the carboxyl group were changed as shown in Table 1, and polymerization time was adjusted to give a weight average molecular weight Mw as shown in Table 1.

TABLE 1

| Polymer Binder | MMA (wt %) | MAA (wt %) | EMA (wt %) | GMA (wt %) | Acid Value | Mw |
|---|---|---|---|---|---|---|
| A | 58 | 35 | 6 | 28 | 95 | 70,000 |
| B | 69 | 25 | 6 | 0 | 140 | 69,000 |
| C | 69 | 25 | 6 | 14 | 95 | 68,000 |

MMA: Methyl methacrylate,
MAA: Methacrylic acid,
EMA: Ethyl methacrylate,
GMA: Glycidyl methacrylate <Preparation of Support>

A 0.24 mm thick aluminum plate (material 1050, quality H16) was degreased at 60° C. for one minute in a 5% sodium hydroxide solution, washed with water, immersed at 25° C. for one minute in 10% hydrochloric acid solution to neutralize, and then washed with water. The resulting aluminum plate was electrolytically etched using an alternating current at 25° C. for 60 seconds at a current density of 100 A/dm$^2$ in a 0.3 weight % nitric acid solution, desmut at 60° C. for 10 seconds in a 5% sodium hydroxide solution. The desmut aluminum plate was anodized at 25° C. for 1 minute at a current density of 10 A/dm$^2$. Thus, support 1 was obtained. The center line average surface roughness (Ra) of the support was 0.65 μm.

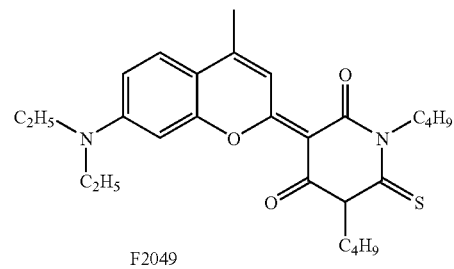

Dye 1

F2049

<Surface Treatment of Support>

The resulting aluminum plate was immersed in the following solution at 80° C. for 30 minutes, washed with deionized water, and dried.

Polyvinyl phosphonic acid (PVPA) 0.6%

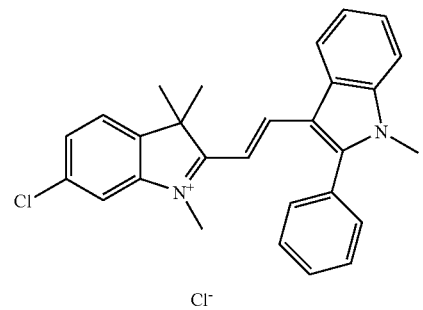

Dye 2

<Preparation of Planographic Printing Plate Material Sample>

The following light sensitive layer coating solution was coated on the resulting support through a wire bar to give a light sensitive layer having a dry thickness of 2.0 g/m$^2$, and dried at 105° C. for 1.5 minutes. After that, the following overcoat layer coating solution was coated on the resulting light sensitive layer through an applicator to give an overcoat layer having a dry thickness of 2.0 g/m$^2$, and dried at 75° C. for 1.5 minutes. Thus, planographic printing plate material samples No. 1 through 11 were obtained, which had an overcoat layer on the light sensitive layer.

(Light Sensitive Layer Coating Solution)

| | |
|---|---|
| Polymer binder (B) | 45.0 parts |
| Dye (as shown in Table 2) | 2.0 parts |
| Polymerization initiator: titanocene compound (IRGACURE784 produced by Ciba Specialty Chemicals Co., Ltd.) | 3.2 parts |
| Co-initiator: Triazine compound (TAZ107 produced by Midori Kagaku Co., Ltd.) | 2.5 parts |
| Ethylenically unsaturated compound (Compound B Tertiary amine urethane monomer) | 30.0 parts |
| Polyethylene glycol #2000 dimethacrylate (NK Ester4G produced by Shinakamura Kagaku Co., Ltd.) | 15.0 parts |
| Phthalocyanine pigment (MHI454, 30% MEK dispersion produced by Mikuni Sikisosha) | 6.0 parts |
| Hindered amine photo-stabilizer (LS770, produced by Sankyo Raifutekku Co., Ltd.) | 1.0 part |
| Fluorine-contained surfactant (F178K: produced by Dainippon Ink Kagaku Kogyo Co., Ltd.) | 0.5 parts |
| Cyclohexanone (bp. 155° C.) | 820 parts |
| (Overcoat Layer Coating Solution) | |
| Polyvinyl alcohol (GL-03, produced by Nippon Gosei Kagaku Co., Ltd.) | 84 parts |
| Polyvinyl pyrrolidone (K-30, produced by ISP JAPAN Co., Ltd.) | 15 parts |
| Surfactant (F1405, produced by Nisshin Kagaku Kogyo Co., Ltd.) | 0.5 parts |
| Water | 900 parts |

Compound B

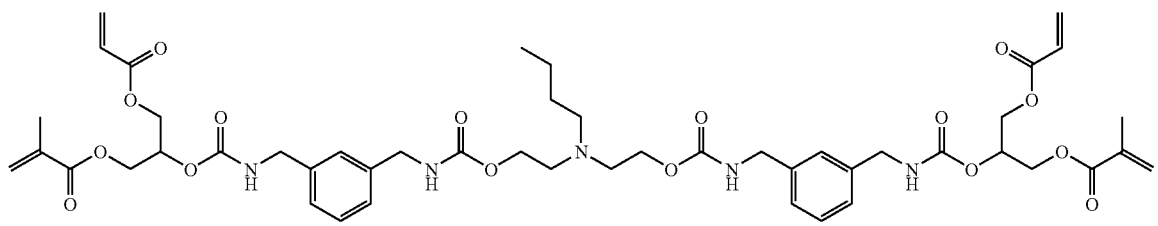

-continued

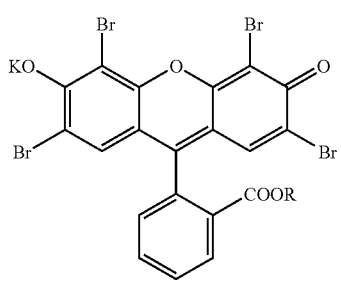
Dye 3

<Image Formation>

The planographic printing plate material sample obtained above was imagewise exposed at a resolving degree of 2400 dpi, employing a CTP exposure device (Tiger Cat produced by ECRM Co., Ltd.) in which a light source emitting a 532 nm light was installed. Herein, dpi represents the dot numbers per 2.54 cm. Subsequently, the exposed sample was subjected to development treatment employing a CTP automatic developing machine (PHW 23-V produced by Technigraph Co., Ltd.) to obtain a planographic printing plate. Herein, the developing machine comprised a preheating section for preheating the exposed sample, a pre-washing section for removing the overcoat layer before development, a development section charged with the following developer 1, a washing section for removing the developer remaining on the developed sample after development, and a gumming section charged with a gumming solution (a solution obtained by diluting GW-3, produced by Mitsubishi Chemical Co., Ltd., with water by a factor of 2) for protecting the surface of the developed sample. Thus, inventive planographic printing plate samples 1 through 8, and comparative planographic printing plate samples 1 through 3 were obtained.

The heating conditions were those in which the printing plate material sample was heated at a surface temperature of 105±10° C. for 15 seconds. The surface temperature was confirmed with a thermo label (produced by Nichiyu Giken Co., Ltd.), which had been adhered to the support of the sample to be heated.

Developer 1 (Aqueous solution containing the following components)

| | |
|---|---|
| Potassium silicate A (Aqueous solution containing 26% by weight of SiO$_2$ and 13.5% by weight of K$_2$O) | 8.0% |
| New Coal B-13SN (produced by Nippon Nyukazai Co., Ltd.) | 2.0% |
| Pronon #204 (produced by Nippon Yushi Co., Ltd.) | 1.0% |
| Ethylenediaminetetraacetic acid disodium salt dihydrate | 0.1% |
| Potassium hydroxide | Amount giving a pH of 12.3 |

<Evaluation of Planographic Printing Plate Material Sample>

The planographic printing plate material sample obtained above was evaluated according to the following methods.

<<Sensitivity>>

Density of the solid images formed on the samples obtained varying exposure energy was measured every exposure energy, and exposure energy giving a density of the maximum density minus a density of 10% of the maximum density was defined as the lowest image formation energy and evaluated as a measure of sensitivity.

<<Printing durability 1>>

The planographic printing plate material sample was imagewise exposed at optimum exposure amount to give a 175 lines/inch image, and developed to obtain a planographic printing plate. Employing the resulting printing plate, printing was carried out on a press (DAIYA1F-1 produced by Mitsubishi Jukogyo Co., Ltd.), wherein a coat paper, printing ink (Toyo Ink Hiecho M Magenta produced by Toyo Ink Manufacturing Co., Ltd.), and dampening water (SG-51, H solution produced by Tokyo Ink Co., Ltd., Concentration: 1.5%) were used. The number of prints printed from the beginning of the printing till when dot reduction at highlight image portions or filling-up at shadow portions was observed was evaluated as a measure of printing durability 1.

<<Storage Stability>>

Each planographic printing plate material sample was stored at 55° C. and 20% RH (relative humidity) for accelerating its deterioration. Sensitivity and printing durability 1 of the resulting sample were evaluated in the same manner as above sensitivity, and printing durability 1, and compared with those of the sample before storage.

<<Preheating Latitude>>

Each planographic printing plate material sample was subjected to development treatment in the same manner as above, preheating temperature being varied. Employing The resulting printing plate, printing was carried out in the printing condition as printing durability 1, and a maximum preheating temperature, at which no stain was observed at exposed portions and no filling-up at shadow portions, was determined. In this evaluation, the planographic printing plate material sample was preheated at various temperature in another heating device under safelight, and developed employing the developing machine above in which power of the preheating section was switched off.

<<Sludge>>

Employing the above developing machine obtained above, 1.5 m$^2$ of the planographic printing plate material sample was preheated, pre-washed to remove the overcoat layer, and developed with the above developer, where the sample was immersed in 100 ml of the developer at 28° C. for 30 seconds without being replenished with a developer replenisher. The resulting developer after development was stored at 40° C. for a week to produce sludge. The sludge was filtered off, washed with water, and dried at 70° C. for one day. The amount of the sludge was measured.

The results are shown in Table 2.

TABLE 2

| Sample No. | Dye used | Sensitivity (μj/cm²) | Printing Durability 1 (×10,000) | Storage Stability Sensitivity | Storage Stability Printing Durability 1 (×10,000) | Preheating Latitude | Sludge Amount (g) |
|---|---|---|---|---|---|---|---|
| 1 (Comp.) | Dye 1 | 70 | 10 | No Change | 10 | 130° C. | 0.25 |
| 2 (Comp.) | Dye 2 | >400 | 0 | — | 0 | — | — |
| 3 (Comp.) | Dye 3 (R: Ethyl) | 150 | 0.1 | >400 | 0 | — | 0.3 |
| 4 (Inv.) | Dye 3 (R: Butyl) | 80 | 7 | No Change | 7 | 160° C. | 0.1 |
| 5 (Inv.) | Dye 3 (R: Hexyl) | 60 | 8 | No Change | 8 | 160° C. | 0.05 |
| 6 (Inv.) | Dye 3 (R: Octyl) | 55 | 10 | No Change | 10 | 160° C. | 0.05 |
| 7 (Inv.) | Dye 3 (R: Decyl) | 50 | 10 | No Change | 10 | 160° C. | 0.2 |
| 8 (Inv.) | Dye 3 (R: Dodecyl) | 50 | 10 | No Change | 10 | 160° C. | 1.0 |
| 9 (Inv.) | Dye 3 (R: Stearyl) | 50 | 10 | No Change | 10 | 160° C. | 1.5 |
| 10 (Inv.) | Dye 3 (R: Phenyl) | 70 | 8 | No Change | 8 | 160° C. | 0.1 |
| 11 (Inv.) | Dye 3 (R: Cyclohexyl) | 70 | 8 | No Change | 8 | 160° C. | 0.06 |

Comp.: Comparative,
Inv.: Inventive

As is apparent from Table 2, the inventive samples employing the anionic dye in the invention provide excellent sensitivity, printing durability, storage stability and preheating latitude.

Example 2

Planographic printing plate material samples No. 12 through 28 were prepared in the same manner as in Example 1, except that the polymer binder, the co-initiator and the dye were changed to those as shown in Table 3, and evaluated in the same manner as in Example 1. Herein, the following printing durability 2 was further evaluated.

<<Printing Durability 2>>

Printing was carried out except that soybean ink Naturalith 100 produced by Dainippon Ink Kagaku Kogyo Co., Ltd. was used as printing ink. The number of prints printed from the beginning of the printing till when dots at highlight image portions were reduced by 3% or filling-up was observed at shadow portions was evaluated as a measure of printing durability 2.

The results are shown in Table 3.

TABLE 3

| Sample No. | Polymer Binder | Co-initiator | Dye 3 (R) | Sensitivity (μj/cm²) | Printing Durability 1 (x 10,000) | Printing Durability 2 (x 10,000) | Storage Stability Sensitivity | Storage Stability Printing Durability 1 (x 10,000) | Preheating Latitude | Sludge Amount (g) |
|---|---|---|---|---|---|---|---|---|---|---|
| 12 (Inv.) | B | CI-13 | Octyl | 70 | 7 | 7 | No Change | 7 | 160° C. | 0.05 |
| 13 (Inv.) | C | CI-13 | Octyl | 55 | 15 | 15 | No Change | 15 | 160° C. | 0.05 |
| 14 (Inv.) | A | CI-13 | Octyl | 50 | 18 | 18 | No Change | 18 | 160° C. | 0.05 |
| 15 (Inv.) | A | BMPS | Octyl | 35 | 40 | 40 | No Change | 40 | 160° C. | 0.05 |
| 16 (Inv.) | A | CI-26 | Octyl | 40 | 40 | 40 | No Change | 40 | 150° C. | 0.05 |
| 17 (Inv.) | A | BR22 | Octyl | 40 | 40 | 40 | No Change | 40 | 140° C. | 0.06 |

TABLE 3-continued

| Sample No. | Polymer Binder | Co-initiator | Dye 3 (R) | Sensitivity (μj/cm²) | Printing Durability 1 (× 10,000) | Printing Durability 2 (× 10,000) | Storage Stability Sensitivity | Printing Durability 1 (× 10,000) | Preheating Latitude | Sludge Amount (g) |
|---|---|---|---|---|---|---|---|---|---|---|
| 18 (Inv.) | A | CL22 | Octyl | 45 | 30 | 30 | No Change | 30 | 160° C. | 0.05 |
| 19 (Inv.) | A | BR43 | Octyl | 40 | 30 | 30 | No Change | 30 | 140° C. | 0.08 |
| 20 (Inv.) | A | BR71 | Octyl | 45 | 30 | 30 | No Change | 30 | 160° C. | 0.05 |
| 21 (Comp.) | C | BMPS | Ethyl | 120 | 1 | 1 | 250 (μi/cm²) | 0 | 160° C. | 0.3 |
| 22 (Inv.) | A | BMPS | Butyl | 60 | 20 | 20 | No Change | 20 | 160° C. | 0.1 |
| 23 (Inv.) | A | BMPS | Hexyl | 40 | 30 | 30 | No Change | 30 | 160° C. | 0.05 |
| 24 (Inv.) | A | BMPS | Decyl | 35 | 40 | 40 | No Change | 40 | 160° C. | 0.2 |
| 25 (Inv.) | A | BMPS | Dodecyl | 35 | 40 | 20 | No Change | 40 | 160° C. | 1.0 |
| 26 (Inv.) | A | BMPS | Stearyl | 35 | 40 | 20 | No Change | 40 | 160° C. | 1.5 |
| 27 (Inv.) | A | BMPS | Phenyl | 40 | 20 | 20 | No Change | 20 | 160° C. | 0.1 |
| 28 (Inv.) | A | BMPS | Cyclohexyl | 40 | 20 | 20 | No Change | 20 | 160° C. | 0.09 |

Comp.: Comparative,
Inv.: Inventive
BMPS

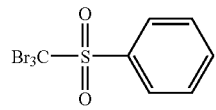

As is apparent from Table 2, the inventive samples, employing a preferred combination of the polymer binder, co-initiator and anionic dye in the invention, provide further improved sensitivity, printing durability, and storage stability, preheating latitude, and minimize sludge.

EFFECT OF THE INVENTION

The present invention can provide a light sensitive composition and a planographic printing plate material providing high sensitivity, excellent coatability, storage stability and developability, and greatly improved printing durability, without producing stain or sludge.

What is claimed is:

1. A planographic printing plate material comprising a hydrophilic support and provided thereon, a light sensitive layer and an overcoat layer in that order, wherein the light sensitive layer contains (a) an alkali soluble polymer, (b) a polymerizable compound having an ethylenically unsaturated bond, (c) a polymerization initiator, and (d) an anionic dye, wherein the polymerization initiator is a metallocene compound, and the anionic dye is represented by the following formula (1), Formula (1)

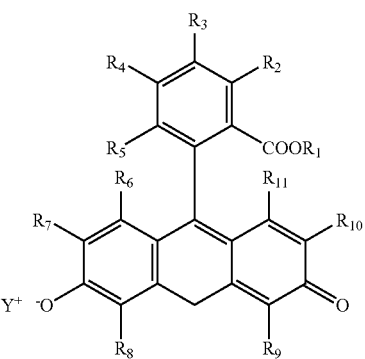

wherein $R_1$ represents a substituted or unsubstituted alkyl group having a carbon atom number of from 4 to 18, a cycloalkyl group having a carbon atom number of from 4 to 18, or a substituted or unsubstituted aryl group having a carbon atom number of from 6 to 18; $R_2$ through $R_{11}$ independently represent a hydrogen atom, a halogen atom, a substituted or unsubstituted alkyl group having a carbon atom number of from 1 to 6, a cycloalkyl group having a carbon atom number of from 4 to 6, a substituted or unsubstituted aryl group having a carbon atom number of from 6 to 18 or —N($R_{12}$)($R_{13}$) in which $R_{12}$ and $R_{13}$ independently represent a substituted or unsubstituted alkyl group having a carbon atom number of from 1 to 6, a cycloalkyl group having a carbon atom number of from 4 to 6, or a substituted or unsubstituted aryl group having a carbon atom number of from 6 to 18; and $Y^+$ represents a hydrogen ion, an alkali metal ion or an onium ion.

2. The planographic printing plate material of claim 1 wherein the light sensitive layer further contains a polyhalogenated compound as the polymerization initiator.

3. The planographic printing plate material of claim 2, wherein the polyhalogenated compound is a polyhalomethylsulfone, a polyhalomethyl oxadiazole, or a compound having a polyhaloacetyl structure represented by the following formula (2), $$R^{21}-CX_2-(C=O)-R_{22} \quad \text{Formula (2)}$$

wherein $R_{21}$ represents a hydrogen atom, a bromine atom, a chlorine atom, an alkyl group, an arylgroup, an acyl group, an alkylsulfonyl group, an arylsulfonyl group or a cyano group; $R_{22}$ represents a hydrogen atom or a monovalent organic substituent, provided that $R^{21}$ and $R^{22}$ may combine with each other to form a ring; and X represents a bromine atom or a chlorine atom.

4. The planographic printing plate material of claim 1, wherein the alkali soluble polymer has a weight average molecular weight of from 15,000 to 500,000, and an acid-value of from 30 to 200.

5. The planographic printing plate material of claim 1, wherein the alkali soluble polymer has a repeating monomer unit having an ethylenically unsaturated bond in an amount of from 5 to 50 mol % in the molecule.

6. The planographic printing plate material of claim 1, wherein the polymerizable compound having an ethylenically unsaturated bond is a polyfunctional acrylate having an amido bond and a secondary or tertiary amino group in the molecule.

7. A process of preparing a planographic printing plate, the process comprising the steps of:
    imagewise exposing the planographic printing plate material of claim 1, employing a laser with an emission wavelength of from 400 to 600 nm;
    heating the resulting exposed material at a temperature of from 80 to 150° C. for 3 to 30 seconds; and
    developing the heated material with an alkali developer having a pH of from 10 to 12.5.

* * * * *